(12) United States Patent
Yu et al.

(10) Patent No.: US 11,209,705 B2
(45) Date of Patent: Dec. 28, 2021

(54) NOTCHED DISPLAY PANEL

(71) Applicant: HannStar Display Corporation, Taipei (TW)

(72) Inventors: Chia-Hua Yu, New Taipei (TW); Sung-Chun Lin, Tainan (TW); Hsien-Tang Hu, Taichung (TW); Hsuan-Chen Liu, Kaohsiung (TW); Chien-Ting Chan, Tainan (TW)

(73) Assignee: HannStar Display Corporation, Taipei (TW)

( * ) Notice: Subject to any disclaimer, the term of this patent is extended or adjusted under 35 U.S.C. 154(b) by 191 days.

(21) Appl. No.: 16/431,712

(22) Filed: Jun. 4, 2019

(65) Prior Publication Data

US 2019/0377234 A1    Dec. 12, 2019

(30) Foreign Application Priority Data

Jun. 6, 2018 (CN) .......................... 201810573350.5
Jun. 6, 2018 (CN) .......................... 201810573351.X
Jun. 6, 2018 (CN) .......................... 201810573353.9

(51) Int. Cl.
| | | |
|---|---|---|
| *G09G 3/36* | (2006.01) | |
| *G02F 1/1362* | (2006.01) | |
| *H01L 27/12* | (2006.01) | |
| *G02F 1/1368* | (2006.01) | |
| *G02F 1/1345* | (2006.01) | |
| *G02F 1/136* | (2006.01) | |

(52) U.S. Cl.
CPC ...... *G02F 1/136286* (2013.01); *G02F 1/1368* (2013.01); *H01L 27/1218* (2013.01); *G02F 1/13454* (2013.01); *G02F 1/13606* (2021.01); *G02F 1/13629* (2021.01); *G02F 2201/56* (2013.01); *G09G 3/3677* (2013.01); *G09G 2310/0286* (2013.01); *G09G 2320/0233* (2013.01)

(58) Field of Classification Search
CPC . G02F 1/13629; G02F 1/1368; G09G 3/3677; H01L 27/1218
See application file for complete search history.

(56) References Cited

U.S. PATENT DOCUMENTS

| | | | |
|---|---|---|---|
| 9,620,077 | B2 | 4/2017 | Shih et al. |
| 10,360,862 | B2 * | 7/2019 | Yeh .................. G02F 1/136286 |
| 2009/0051636 | A1 | 2/2009 | Natori |

(Continued)

FOREIGN PATENT DOCUMENTS

| | | |
|---|---|---|
| CN | 105427748 A | 3/2016 |
| CN | 107301831 A | 10/2017 |

(Continued)

*Primary Examiner* — Kevin M Nguyen
(74) *Attorney, Agent, or Firm* — CKC & Partners Co., LLC

(57) ABSTRACT

A display panel has an odd-shaped active area and a peripheral area. The display panel includes a substrate, pixel units, gate lines and at least one dummy thin film transistor. The pixel units are disposed on the active area of the substrate. The gate lines are disposed on the substrate, each of the gate lines is coupled to one or more of the pixel units, and the number of pixel units coupled to a first gate line of the gate lines is smaller than the number of pixel units a second gate line coupled to of the gate lines. The dummy thin film transistor is disposed on the substrate, and is coupled to the first gate line.

7 Claims, 25 Drawing Sheets

(56) References Cited

U.S. PATENT DOCUMENTS

| | | | |
|---|---|---|---|
| 2009/0102824 A1 | 4/2009 | Tanaka et al. | |
| 2018/0090061 A1* | 3/2018 | Kim | ................... G09G 3/3233 |
| 2018/0342572 A1* | 11/2018 | Park | ................... H01L 27/3246 |

FOREIGN PATENT DOCUMENTS

| | | | |
|---|---|---|---|
| CN | 107422556 A | 12/2017 |
| CN | 107481669 A | 12/2017 |
| CN | 107610645 A | 1/2018 |
| CN | 107622749 A | 1/2018 |
| CN | 107634072 A | 1/2018 |
| CN | 107705756 A | 2/2018 |
| CN | 107749287 A | 3/2018 |
| CN | 107942564 A | 4/2018 |
| CN | 107966864 A | 4/2018 |
| CN | 207217536 U | 4/2018 |
| CN | 107993579 A | 5/2018 |
| CN | 107993581 A | 5/2018 |
| CN | 108010947 A | 5/2018 |

\* cited by examiner

NOTCHED DISPLAY PANEL

RELATED APPLICATIONS

This application claims priority to Chinese Application Serial Number 201810573350.5, filed on Jun. 6, 2018, Chinese Application Serial Number 201810573351.X, filed on Jun. 6, 2018, and Chinese Application Serial Number 201810573353.9, filed on Jun. 6, 2018, which are herein incorporated by reference.

BACKGROUND

Field of Invention

The present invention relates to a display panel, and more particularly to a display panel that has an odd-shaped active area.

Description of Related Art

Nowadays, with the development of display panel manufacturing technologies, high definition display panels have been already applied to wearable and handheld electronic devices, such as smartwatches and health wristbands. On the other hand, consumers' aesthetic demands on electronic devices are increasing, and thus display panels with particular appearances are applied to electronic devices. Display panels of these electronic devices often have non-rectangular shapes, such as a circular shape or another irregular shape.

For example, FIG. 1 illustrates a schematic diagram of a conventional rectangular display panel, and FIG. 2A and FIG. 2B respectively illustrate various conventional odd-shaped display panels. Each of the display panels 100, 200A, 200B in FIG. 1, FIG. 2A and FIG. 2B includes pixel rows R(1)-R(N) respectively coupled to corresponding gate lines (not shown). Each of the pixel rows R(1)-R(N) includes pixels, and each pixel include a thin film transistor and a pixel electrode. Each gate line has a corresponding resistance, and there are parasitic capacitors between each gate line and its corresponding thin film transistors, such as gate/source capacitances (Cgs) and gate/drain capacitors (Cgd) respectively generated by the thin film transistors TFT, and thus each gate line has a corresponding resistive-capacitive loading (RC loading). An active area 110 of the display panel 100 in FIG. 1 is rectangular, and thus the numbers of pixels in the pixel rows R(1)-R(N) are the same, such that the resistive-capacitive loadings of the gate lines of the display panel 100 in FIG. 1 are the same. As shown in FIG. 2A and FIG. 2B, a top side of each of the display panels 200A and 200B has a notch, and the top side of each of active areas 210A and 210B also has a corresponding notch. In addition, the difference between FIG. 2A and FIG. 2B is that, in FIG. 2A, the lower-left and lower-right corners of the active area 210A are right angels, while in FIG. 2B, the lower-left and lower-right corners of the active layer 210B are arced. Therefore, as shown in the display panel 200A of FIG. 2A, the upper portion of the active area 210A has an irregular region 210A_U, while as shown in the display panel 200B of FIG. 2B, the upper portion and the lower portion of the active layer 210B have irregular regions 210B_U and 210B_L respectively. As shown in FIG. 2A and FIG. 2B, the number of pixels of each pixel row (such as the pixel row R(j)) in the irregular regions 210A_U and 210B_U is less than the number of pixels of each pixel row (such as the pixel row R(i)) in the regular region (e.g. the region excluding the irregular region 210A_U in the active area 210A and the region excluding the irregular regions 210B_U, 210B_Lin in the active area 210B. That is, the number of thin film transistors in the pixel row R(j) is less than the number of thin film transistors in the pixel row R(i), and therefore the capacitance of the parasitic capacitor coupled to the gate line of the pixel row R(j) is smaller than the capacitance of the parasitic capacitor coupled to the gate line of the pixel row R(i). Therefore, the resistive-capacitive loadings of the gate lines of the pixel rows (such as the pixel row R(j)) in the irregular regions 210A_U, 210B_U are different from the resistive-capacitive loadings of the gate lines of the pixel rows (such as the pixel row R(i)) in the regular region, thus resulting in an image displayed with incorrectly gray levels in some specific regions. Specially, the irregular regions 210A_U and 210B_U include notches, and the number of pixels in each pixel row in the irregular regions 210A_U and 210B_U is quite different from the number of pixels in each pixel row in the regular region, thus causing a significant difference between the brightness at two sides of the notch in the active area and the brightness in the regular region of the active area for image display, resulting in degradation of image display quality. Therefore, how to make the resistive-capacitive loadings of the gate lines in the irregular region with a notch the same as or approximately the same as the resistive-capacitive loadings of the gate lines in the regular region is an urgent issue to be solved.

SUMMARY

The objective of the invention is to provide a display panel that has an odd-shaped active area and includes resistance and capacitance compensation functions for the gate lines, thereby preventing problems such as image displayed with incorrect gray levels.

One aspect of the invention is directed to a display panel which has an odd-shaped active area and a peripheral area. The display panel includes a substrate, pixel units, gate lines and at least one dummy thin film transistor. The pixel units are disposed on the active area of the substrate. The gate lines are disposed on the substrate, in which each of the gate lines is coupled to one or more of the pixel units, and the number of pixel units coupled to a first gate line of the gate lines is smaller than the number of pixel units a second gate line coupled to of the gate lines. The dummy thin film transistor is disposed on the substrate, and is coupled to the first gate line.

In one embodiment of the invention, the active area has first and second subareas that are opposite to each other, a gap is between the first substrate and the second substrate, and the dummy thin film transistor is disposed in the gap.

In one embodiment of the invention, the active area further has a rectangular region, the first subarea and the second subarea are connected to a side edge of the rectangular region, and the second gate line is in the rectangular region.

In one embodiment of the invention, the first gate line has a first portion, a second portion and a third portion that are located in the first subarea, the gap and the second subarea respectively, two terminals of the second portion are respectively coupled to the first portion and the third portion, and the dummy thin film transistor is coupled to the second portion.

In one embodiment of the invention, the second portion of the first gate line includes a lower wiring and an upper wiring which are formed from different conductive layers, and the upper wiring is electrically connected to the lower wiring.

In one embodiment of the invention, the first portion and the third portion of the first gate line and the lower wiring are formed from a first conductive layer, and the upper wiring is formed from a second metal layer.

In one embodiment of the invention, the upper wiring is overlapped with the lower wiring in a direction perpendicular to the substrate.

In one embodiment of the invention, a third gate line of the gate lines has a first portion, a second portion and a third portion that are located in the first subarea, the gap and the second subarea, respectively, the second portion of the third gate line has includes another lower wiring and another upper wiring over the another lower wiring, and the another upper wiring is overlapped with the another lower wiring in the direction perpendicular to the substrate. A width of the upper wiring is different from a width of the another upper wiring.

In one embodiment of the invention, the display panel further includes a conductive layer that is disposed over and insulated from the second portion of the first gate line. A portion of the conductive layer is overlapped with the second portion of the first gate line in a direction perpendicular to the substrate.

In one embodiment of the invention, the conductive layer is supplied with a predetermined voltage.

In one embodiment of the invention, the conductive layer is supplied with a common voltage, each of the pixel units includes a common electrode, and the conductive layer includes the common electrodes of the pixel units.

In one embodiment of the invention, the display panel further includes a common electrode signal wiring that is disposed between an edge of the active area and an edge of the display panel. The dummy thin film transistor is disposed between the pixel units and the common electrode signal wiring.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
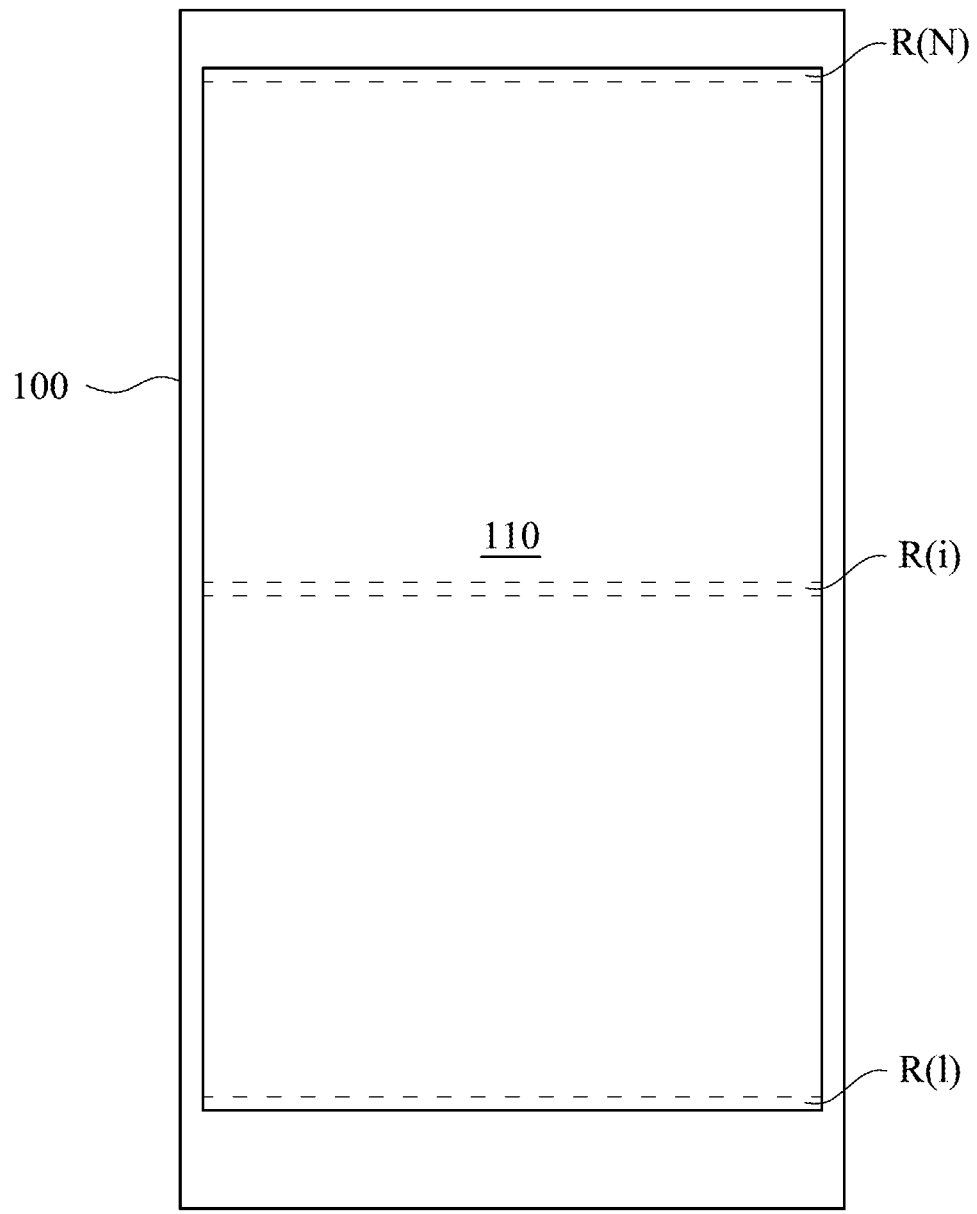
FIG. 1 is a schematic diagram of a known rectangular display panel.
Figure 2A:
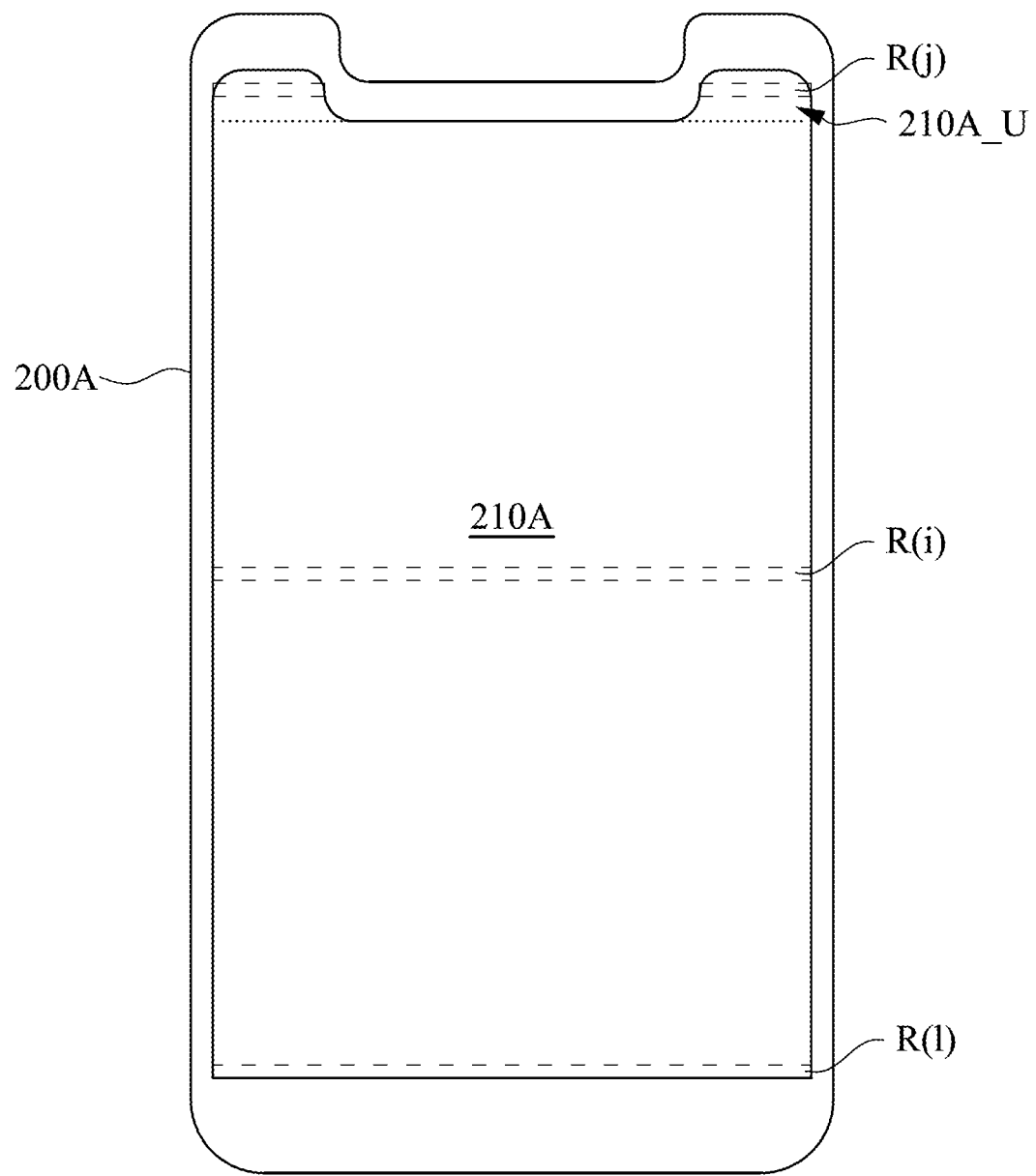
FIG. 2A and FIG. 2B are various conventional display panels with odd-shaped active areas.
Figure 2B:
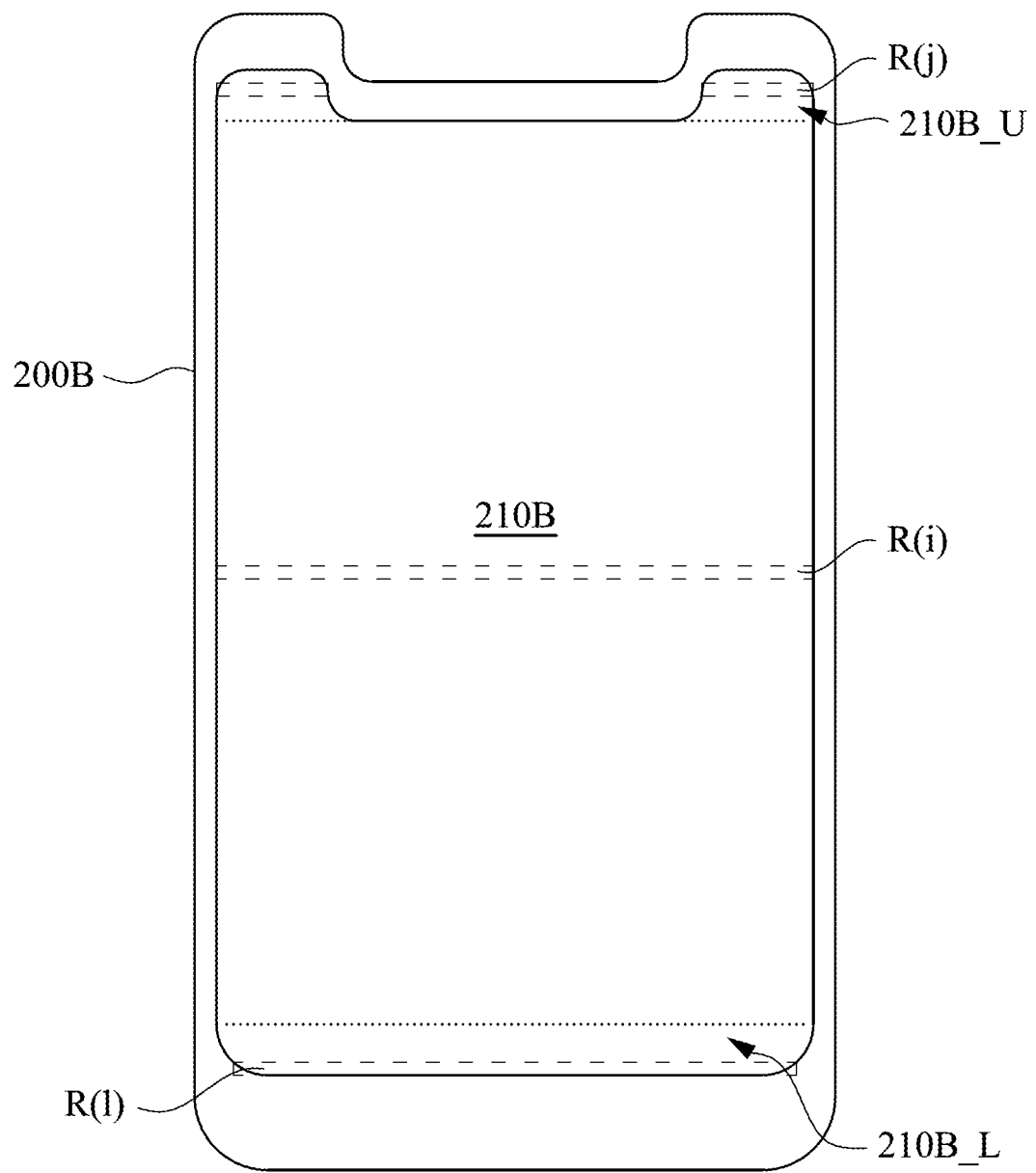

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall in the scope of the present invention. Additionally, the drawings are only illustrative and are not drawn to actual size.

It will be understood that, although the terms "first," "second," and "third" may be used herein to describe various elements, components, areas, layers and/or portions, these elements, components, areas, layers and/or portions, should not be limited by these terms. These terms are only used to distinguish elements, components, areas, layers and/or portions.

Terms used herein are only used to describe the specific embodiments, which are not used to limit the claims appended herewith. Unless limited otherwise, the term "a," "an," "one" or "the" of the single form may also represent the plural form. Further, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The document may repeat reference numerals and/or letters in the various examples. This repetition is for the purpose of simplicity and clarity and does not in itself dictate a relationship between the various embodiments and/or configurations discussed.

Regarding the term "coupled" used in the following description, it may be used to indicate that two or more elements are in direct physical or electrical contact with each other, or may also mean that two or more elements may not be in direct contact with each other. "Coupled" may still be used to indicate that two or more elements cooperate or interact with each other.

Figure 3:
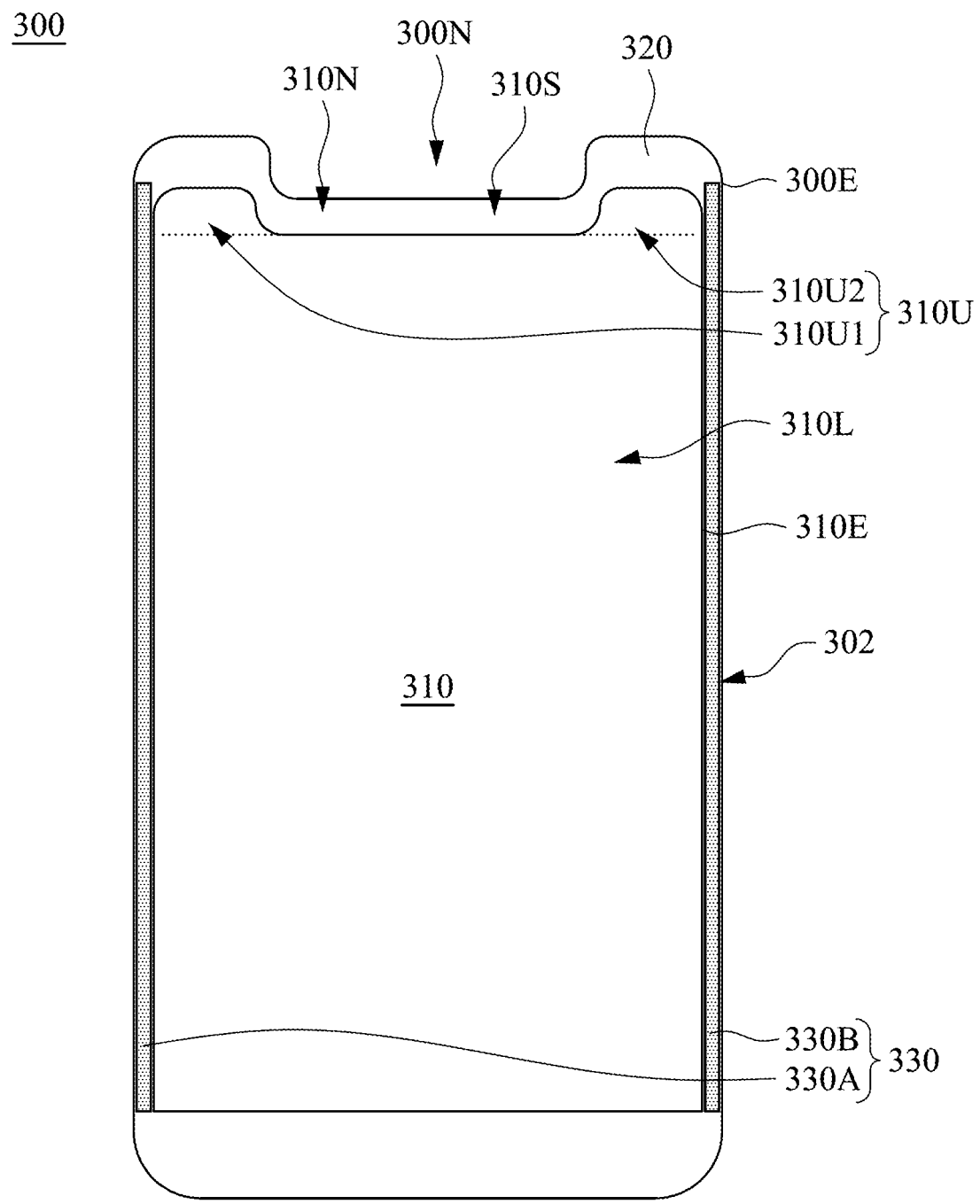
FIG. 3 is a schematic diagram of a display panel with an odd-shaped active area in accordance with some embodiments of the invention.

Referring to FIG. 3, FIG. 3 is a schematic diagram of a display panel 300 in accordance with some embodiments of the invention. The display panel 300 may be, for example, a liquid crystal display of twisted nematic (TN) type, in-plane switching (IPS) type, fringe-field switching (FFS) type, vertical alignment (VA) type, reflective type or transflective type, or an organic light emitting diode (OLED) display panel, but is not limited thereto. The display panel 300 includes a substrate 302 and has an active area 310 for displaying an image and a peripheral area 320 adjoining the active area 310. In the display panel, pixel units (not shown) are disposed in the active area 310 of the substrate 302, and a gate driving circuit 330 is disposed in the peripheral area 320 of the substrate 302 for generating and transmitting scan signals to the gate lines, such that the pixel units in the active area 310 is driven by the scan signals to display an image at a specific time point.

In some embodiments, the display panel 300 is a system on glass (SOG) panel. That is, the gate driving circuit 330 is formed on the substrate 302 of the display panel 300. As such, the electrical components in the gate driving circuit 330 and the active area 310 (such as, but not limited to, thin film transistors) may be formed simultaneously by the same process or processes. In other embodiments, the gate driving circuit 330 may be in a chip, and such chip may be bonded to the connection pads disposed on the substrate 302 by a method such as chip on glass (COG), tape automated bonding (TAB), chip on film (COF), so as to provide scan signal to the gate lines.

In addition, the display panel 300 is an odd-shaped display panel. As shown in FIG. 3, the edge 300E of the display panel 300 has an irregular shape and has a notch 300N at the top side of the display panel 300. The active area 310 is an odd-shaped active area, and also has a notch 310N at the top side of the active area 310 and is arranged corresponding to the notch 300N. In the context, the notch 310N of the active area 310 and the notch 300N of the display panel 300 may also be referred to as a first notch and a second notch, respectively. Besides, the shapes of the upper-left corner and the upper-right corner of both of the display panel 300 and the active area 310 are arcs instead of right angles, but are not limited thereto. As shown in FIG. 3, the active area 310 includes a regular region (e.g. rectangular region) 310L and an irregular region 310U. If the sizes of the pixel units in the active area 310 are the same, then in the regular region 310L of the active area 310, the pixel rows have the same number of pixel units, and in the irregular region 310U of the active area 310, the irregular region 310U includes subareas 310U1 and 310U2. The subareas 310U1 and 310U2 are opposite to each other, and a gap 310S is between the subareas 310U1 and 310U2. The subareas 310U1 and 310U2 are disposed respectively at the upper-left side and the upper-right side of the rectangular region 310L, and are connected to the upper side edge of the rectangular region 310L. Therefore, the combination of the subareas 310U1 and 310U2 and the rectangular region 310L may form the active area 310 with the notch 310N, and the right side edge of the subarea 310U1, the left side edge of the subarea 310U2 and a portion of the upper side edge of the rectangular region 310L form the edge of the notch 310N. As shown in FIG. 3, the display units are neither disposed in the gap 310S between the subareas 310U1 and 310U2, and therefore, in the irregular region 310U, each pixel row includes the pixel units in the subareas 310U1 and 310U2, i.e., some pixel units in each of the pixel rows are in the subarea 310U1, while the other pixel units are in the subarea 310U2, and none of the pixel units is disposed in the gap 310S (or the notch 310N). Therefore, the number of pixel units in each pixel row of the irregular region 310U is less than the number of pixel units in each pixel row of the regular region 310L. In the context, the subareas 310U1, 310U2 may be respectively referred to as a first subarea and a second subarea. In addition, the numbers of pixel units of different pixel rows of the irregular region 310U may be different from each other. However, the invention is not limited thereto. In variant embodiments, at least some of the pixel rows of the irregular region 310U have the same number of the pixel units. As shown in FIG. 3, in the irregular region 310U, the area of the uppermost pixel row is smaller than the area of the lowermost pixel row, and therefore, the number of pixel units of the uppermost pixel row is less than the number of pixel units of the lowermost pixel row. In summary, the display panel 300 includes pixel rows R(1)-R(N), in which the pixel rows R(1)-R(N') are disposed in the regular region 310L of the active area 310, and the numbers of pixel units of the pixel rows R(1)-R(N') are all M, while the pixel rows R(N'+1)-R(N) are disposed in the irregular region 310U of the active area 310, and the numbers of pixel units of the pixel rows R(N'+1)-R(N) are all less than M, where N' is an positive integer less than N. In addition, in some embodiments, at least some of the pixel rows R(N'+1)-R(N) have different numbers of pixel units. In the following description, the largest number of pixel unit of the pixel rows is M, while the largest number of pixel units of the pixel columns is N.

Figure 4:
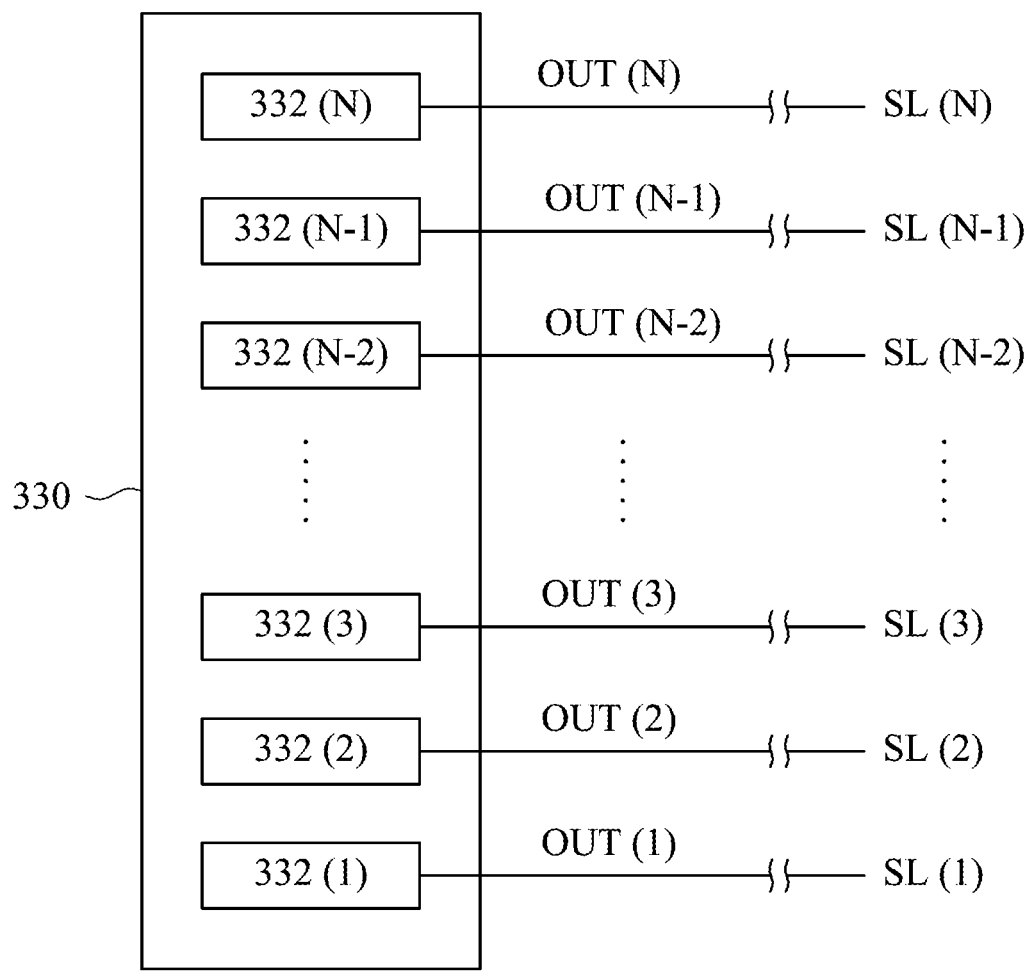
FIG. 4 is a schematic diagram of the gate driving circuit in FIG. 3.

Referring to FIG. 3 and FIG. 4, in which FIG. 4 is a schematic diagram of the gate driving circuit 330 in FIG. 3. As shown in FIG. 4, the gate driving circuit 330 is disposed in the peripheral area 320. The gate driving circuit 330 includes N shift registers 332(1)-332(N) that respectively and sequentially output the scan signals OUT(1)-OUT(N) to the gate line SL(1)-SL(N). For example, in a frame period, at beginning the $1^{st}$ stage shift register 332(1) outputs the $1^{st}$ stage scan signal OUT(1) to the gate line SL(1), and then after a time t is elapsed, the $2^{nd}$ stage shift register 332(2) outputs the $2^{nd}$ stage scan signal OUT(2) to the gate line SL(2), and then after a time t is elapsed, $3^{rd}$ stage shift register 332(3) outputs the $3^{rd}$ stage scan signal OUT(3) to the gate line SL(3), and so on, until the $N^{th}$ stage shift register 332(N) outputs the $N^{th}$ stage scan signal OUT(N) to the gate line SL(N). In another embodiment, the gate driving circuit 330 may sequentially output the scan signals OUT(1)-OUT(N) to the gate lines SL(1)-SL(N) in the active area 310 in a reverse direction. For example, in a frame period, the $N^{th}$ stage shift register 332(N) outputs the $N^{th}$ stage scan signal OUT(N) to the gate line SL(N), and then after a time t is elapsed, the $(N-1)^{th}$ stage shift register 332(N-1) outputs the $(N-1)^{th}$ stage scan signal OUT(N-1) to the gate line SL(N-1), and then after a time t is elapsed, the $(N-2)^{th}$ stage shift register 332(N-2) outputs the $(N-2)^{th}$ stage scan signal OUT(N-2) to the gate line SL(N-2), and so on, until the $1^{st}$ stage shift register 332(1) outputs the $1^{st}$ stage scan signal OUT(1) to the gate line SL(1).

In FIG. 3, the gate driving circuit 330 includes a first gate driving circuit 330A and a second gate driving circuit 330B respectively disposed at two opposite sides of the active area 310. One of the first gate driving circuit 330A and the second gate driving circuit 330B may include odd-numbered stage shift registers 332(1), 332(3), . . . , 332(N-1), to respectively and sequentially output odd-numbered stage scan signals OUT(1), OUT(3), OUT(N-1) to the odd gate lines SL(1), SL(3), SL(N-1), and the other of the first gate driving circuit 330A and the second gate driving circuit 330B includes even-numbered stage shift registers 332(2), 332(4), . . . , 332(N) to respectively and sequentially output even-numbered stage scan signals OUT(2), OUT(4), OUT(N) to the even gate lines SL(2), SL(4), SL(N). However, the invention is not limited thereto. In another embodiment, the two terminals of each of the gate lines SL(1)-SL(N) are coupled to the first gate driving circuit 330A and the second gate driving circuit 330B, and each of the first gate driving circuit 330A and the second gate driving circuit 330B includes N shift registers 332(1)-332(N) for respectively outputting the scan signals OUT(1)-OUT(N) to the gate lines SL(1)-SL(N).

In other words, the two terminals of each of the gate line SL(1)-SL(N) simultaneously receive the corresponding scan signals outputted by the first gate driving circuit 330A and the second gate driving circuit 330B, so as to increase the driving ability.

In the embodiment of FIG. 3, the gate driving circuit 330 includes the first gate driving circuit 330A and the second gate driving circuit 330B disposed respectively at two opposite sides of the active area 310 However, the invention is not limited thereto. In variant embodiments, the gate driving circuit 330 may be disposed only at one side of the active area 310 and include N shift registers 332(1)-332(N) for outputting the scan signals OUT(1)-OUT(N) to the gate lines SL(1)-SL(N).

Figure 5:
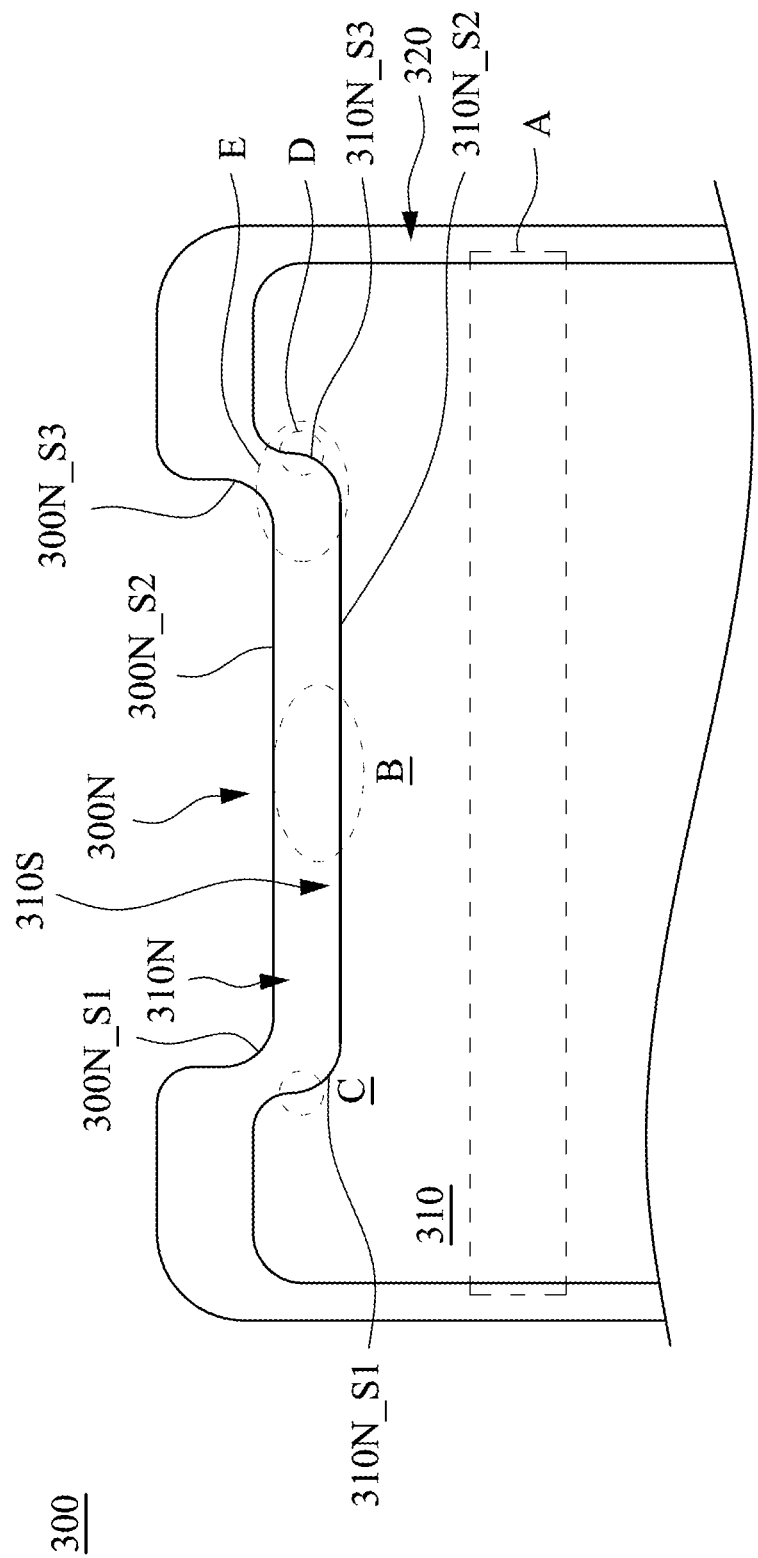
FIG. 5 is a partial enlarged view of the display panel in FIG. 3.
Figure 6A:
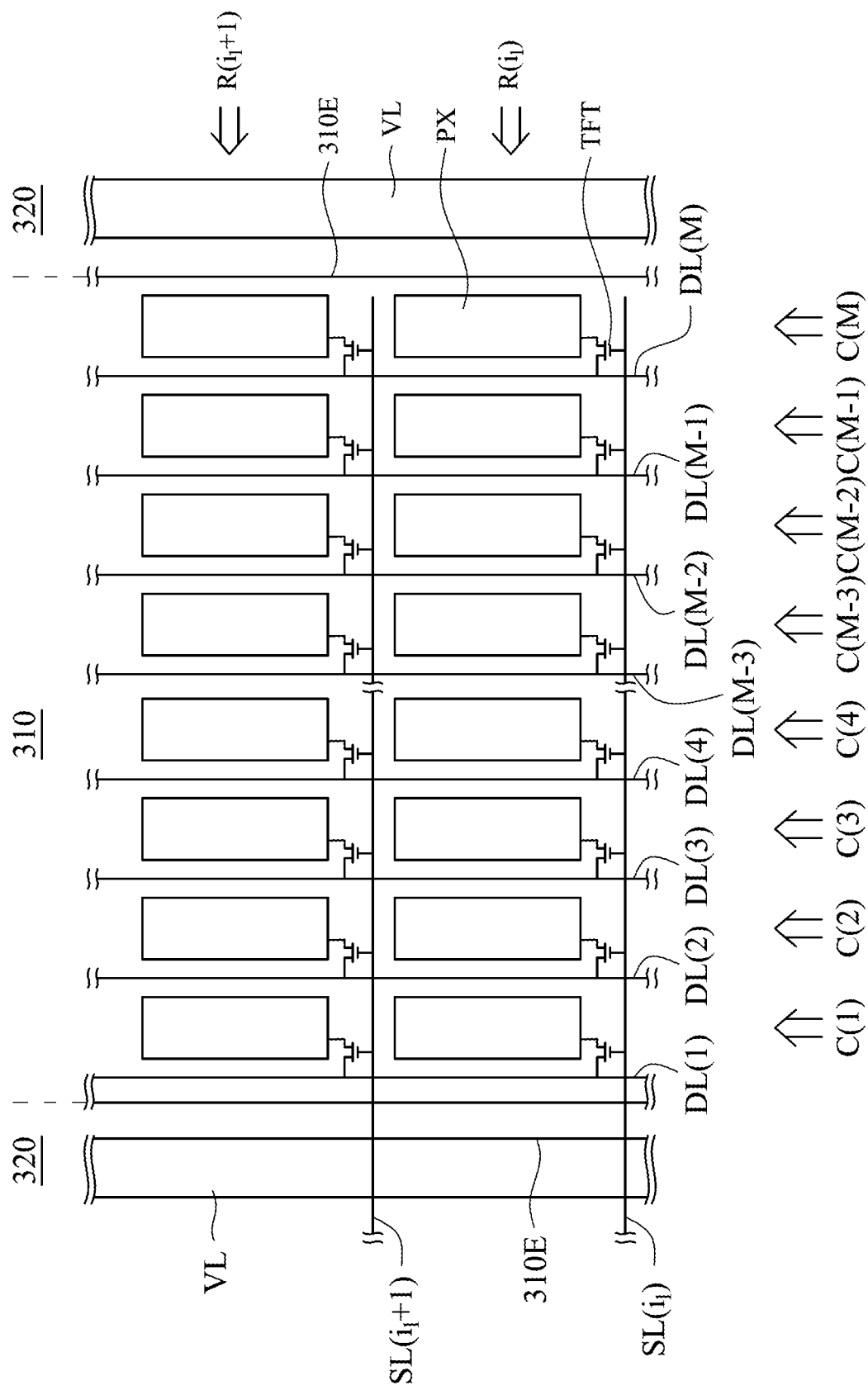
FIG. 6A to FIG. 6D are pixel unit and component arrangements in various regions of the active area in FIG. 3.

Referring to FIG. 5 and FIG. 6A, FIG. 5 is a partial enlarged view of the display panel in FIG. 3 and in which the gate driving circuit 330 is omitted, and FIG. 6A illustrates pixel unit and component arrangements in a part of the regular region 310L of the active area 310 corresponding to the area A in FIG. 5. As shown in FIG. 5, the notch 300N of the display panel 300 includes the first to third side edges 300N_S1, 300N_S2 and 300N_S3, the notch 310N of the active area 310 includes the first to third side edges 310N_S1, 310N_S2 and 310N_S3, in which the first side edge 300N_S1 and the third side edge 300N_S3 are respectively connected to the two opposite terminals of the second side edge 300N_S2, and the first side edge 310N_S1 and the third side edge 310N_S3 are respectively connected to the two opposite terminals of the second side edge 310N_S2, and the second side edges 300N_S2 and 310N_S2 are respectively the bottom edges of the notches 300N and 310N. As previously described, the right side edge of the subarea 310U1, the left side edge of the subarea 310U2 and a portion of the upper side edge of the rectangular region 310L form the edge of the notch 310N, and therefore, the first to third side edges 310N_S1, 310N_S2 and 310N_S3 of the notch 310N of the active area 310 may be the right side edge of the subarea 310U1, a portion of the upper side edge of the rectangular region 310L and the left side edge of the subarea 310U2, respectively. As shown in FIG. 6A, in the regular region 310L of the active area 310, each of the intersections of the pixel columns C(1)-C(M) and the pixel rows (e.g. the pixel rows R($i_1$) and R($i_1$+1)) has a thin film transistor TFT and a pixel electrode PX. Taking the pixel unit at the intersection of the pixel column C(1) and the pixel row R($i_1$) as an example for explanation, the thin film transistor TFT is coupled to the data line DL(1) and the gate line SL($i_1$), and controls whether to input the data signal provided by the data line DL(1) to the pixel electrode PX based on the scan signal provided by the gate line SL($i_1$) (i.e. the scan signal OUT($i_1$)). The thin film transistor TFT may be an amorphous silicon thin film transistor, a low temperature polysilicon (LTPS) thin film transistor, an indium gallium zinc oxide (IGZO) thin film transistor, or another suitable thin film transistor. In the regular region 310L of the active area 310, the pixel rows have the same number of pixel units (In other words, having the same number of thin film transistors and pixel electrodes). In addition, the peripheral area 320 (i.e. between the edge 310E of the active area 310 and the edge 300E of the display panel 300) may have a common electrode signal wiring VL for providing a common voltage to the common electrodes (not shown in FIG. 6A) of the pixel units, such that the liquid crystal molecules in the pixel units twist by the electrical fields generated between the corresponding pixel electrodes PX and the common electrodes. For example, the common electrode signal wiring VL may be disposed as an enclosed ring (Vcom Ring) that surrounds the active area 310. However, the invention is not limited thereto. In variant embodiments, the common electrode signal wiring VL may be disposed as a non-closed wiring.

Figure 6B:
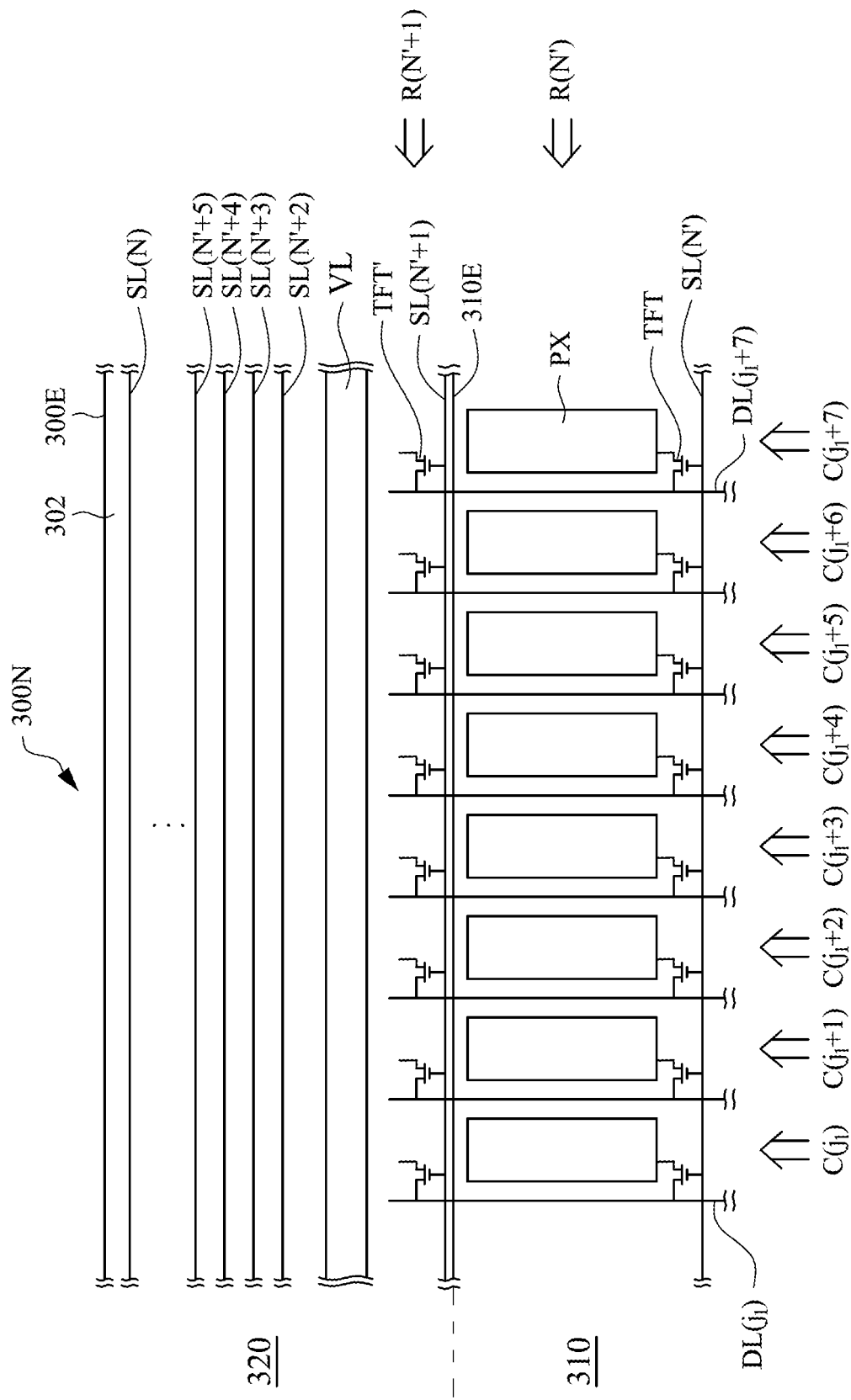

FIG. 6B illustrates pixel unit and component arrangements corresponding to the area B in FIG. 5. As shown in FIG. 6B, in the area corresponding to the area B in FIG. 5, the uppermost pixel row in the regular region 310L of the active area 310 is the pixel row R(N'), and the gate line SL(N'+1)-SL(N) and the common electrode signal wiring VL are disposed in the peripheral area 320 and between the subareas 310U1 and 310U2. All of the gate lines SL(N'+1)-SL(N) extend into the subareas 310U1 and 310U2 respectively at left and right sides of the gap 310S (or the notch 310N) for respectively coupling the pixel rows R(N'+1)-R(N) (not shown), in which some of the pixels of the pixel rows R(N'+1)-R(N) are disposed in the subarea 310U1, while the other pixel units are disposed in the subarea 310U2.

As shown in FIG. 6B, the intersections of the pixel columns C($j_1$)-C($j_1$+7) and the pixel row R(N') respectively have pixel units (each including a thin film transistor TFT and a pixel electrode PX), while neither of the intersections of the pixel columns C($j_1$)-C($j_1$+7) and the pixel rows R(N'+1)-R(N) have a pixel unit. Therefore, in order to compensate for the inconsistencies of the resistive-capacitive loadings of the gate lines SL(N'+1)-SL(N) and of the gate line SL(1)-SL(N'), dummy thin film transistors may be disposed in the peripheral area 320 and coupled to one or more gate lines SL(N'+1)-SL(N) to add extra parasitic capacitors on the gate lines SL(N'+1)-SL(N). For example, in some embodiments, as shown in FIG. 5 and FIG. 6B, the dummy thin film transistors TFT' disposed in the gap 310S (or the notch 310N) between the subareas 310U1, 310U2 of the active area 310 are coupled to the gate line SL(N'+1), and are respectively coupled to the data lines DL($j_1$)-DL($j_1$+7). The dummy thin film transistors TFT' and the thin film transistors TFT may have the same structure, and each dummy thin film transistors TFT' may also have parasitic capacitors such as a gate/source capacitor and a gate/drain capacitor for compensating the parasitic capacitor on the gate line SL(N'+1). Similarly, the dummy thin film transistors TFT' may be amorphous silicon thin film transistors, LTPS thin film transistors, IGZO thin film transistors, or other suitable thin film transistors.

As shown in FIG. 6B, the common electrode signal wiring VL is disposed between the gate lines SL(N'+1) and SL(N'+2), and the dummy thin film transistor TFT' is coupled to the gate line SL(N'+1). In other words, the edge 310E of the active area 310 shown in FIG. 6B is the second side edge 310N_S2 of the notch 310N of the active area 310 shown in FIG. 5, and therefore the dummy thin film transistor TFT' shown in FIG. 6B is disposed between the pixel units near the second side edge 310N_S2 of the notch 310N of the active area 310 and the common electrode signal wiring VL. However, the invention is not limited thereto. In variant embodiments, the dummy thin film transistor TFT' may be disposed between the common electrode signal wiring VL and the second side edge 300N_S2 of the notch 300N of the display panel 300. It is noted that the arrangement of the dummy thin film transistor TFT' and the common electrode signal wiring VL illustrated in FIG. 6 are merely examples, but the invention is not limited thereto. For example, In some other embodiments, the location of the common electrode signal wiring VL may be adjusted (e.g. disposed between the gate lines SL(N'+2) and SL(N'+3), but the invention is not limited thereto), and/or at least two of the gate lines SL(N'+1)-SL(N) in the gap 310S (or the notch 310N) which is between the subareas 310U1, 310U2 are respectively coupled to at least one dummy thin film transistor TFT' for compensating the parasitic capacitors on at least two of the gate lines SL(N'+1)-SL(N). In addition, in some other embodiments, the common electrode signal wiring VL may not be disposed in the peripheral area 320 between the second side edge 300N_S2 of the notch 300N of the display panel 300 and the second side edge 310N_S2 of the notch 310N of the active area 310, and at least one of the gate lines SL(N'+1)-SL(N) is coupled to at least one dummy thin film transistors TFT' in the gap 310S (or the notch 310N) which is between the subareas 310U1, 310U2, so as to compensate the parasitic capacitor on at least one of the gate lines SL(N'+1)-SL(N'). It is noted that, in some embodiments, the gate lines SL(N'+1)-SL(N) are neither coupled to the dummy thin film transistors TFT' in the peripheral area 320 between the second side edge 300N_S2 of the notch 300N of the display panel 300 and the second side edge 310N_S2 of the notch 310N of the active area 310 (e.g. the area B in FIG. 5). Instead, the gate lines SL(N'+1)-SL(N) are coupled to the dummy thin film transistor TFT' near the first side edge 310N_S1 of the notch 310N of the active area 310 (e.g. the embodiment of FIG. 6C mentioned later) and near the third side edge 310N_S3 of the notch 310N of the active area 310 (e.g. the embodiment of FIG. 6D mentioned later), so as to compensate the parasitic capacitors on the gate line SL(N'+1)-SL(N).

Figure 6C:
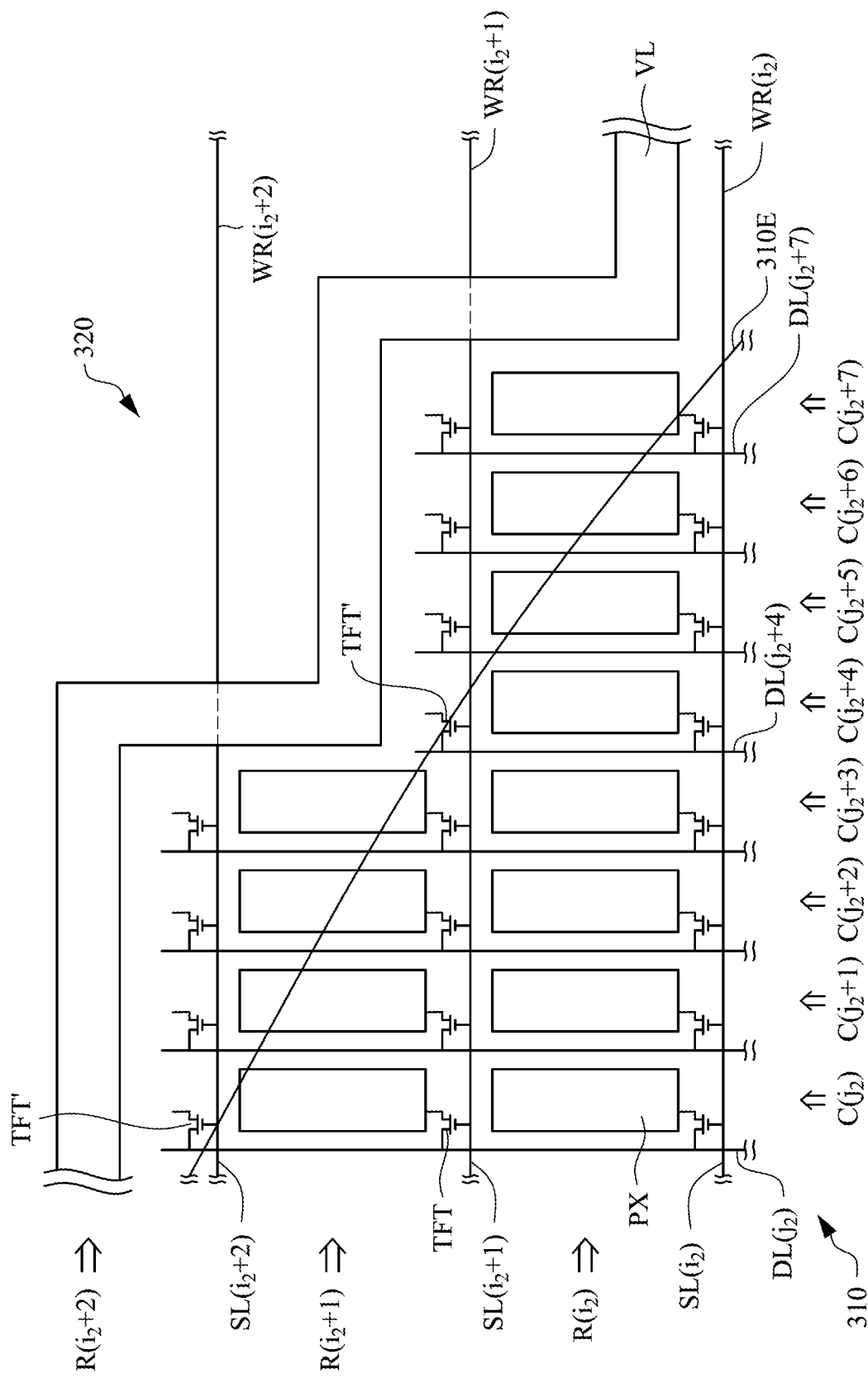

FIG. 6C illustrates pixel unit and component arrangements in a part of the subarea 310U1 of the active area 310 corresponding to the area C in FIG. 5. As shown in FIG. 6C, in the subarea 310U1 of the active area 310, the number of pixel units in the upper pixel row is less than or equal to the number of pixel units in the lower pixel row. For example, as shown in FIG. 6C, the number of pixel units in the pixel row R($i_2$+1) is less than the number of pixel units in the pixel row R($i_2$). However, the invention is not limited thereto. In variant embodiments, the numbers of pixels from lower to upper pixel rows in the subarea 310U1 may be sequentially decreasing, sequentially increasing, identical to each other, or irregularly changing.

As shown in FIG. 5 and FIG. 6C, the dummy thin film transistors TFT' are disposed in a part of the peripheral area 320 near the first side edge 310N_S1 of the notch 310N of the active area 310, and are coupled to at least some of the gate lines SL(N'+1)-SL(N), so as to compensate the parasitic capacitors on at least some of the gate lines SL(N'+1)-SL(N). For example, in FIG. 6C, each of the intersections of the gate line SL($i_2$+1) and the data lines DL($j_2$+4)-DL($j_2$+7) and the intersections of the gate line SL($i_2$+2) and the data lines DL($j_2$)-DL($j_2$+3) is coupled to a dummy thin film transistor TFT', so as to compensate the parasitic capacitor on the gate lines SL($i_2$+1) and SL($i_2$+2). In addition, in the embodiment of FIG. 6C, the edge 310E of the active area 310 shown in FIG. 6C is the first side edge 310N_S1 of the notch 310N of the active area 310 shown in FIG. 5, and therefore the common electrode signal wiring VL is disposed between the first side edge 300N_S1 of the notch 300N of the display panel 300 and the first side edge 310N_S1 of the notch 310N of the active area 310, and the dummy thin film transistors TFT' are disposed between the pixel units near the first side edge 310N_S1 of the notch 310N of the active area 310 and the common electrode signal wiring VL. However, the invention is not limited thereto. In variant embodiments, the dummy thin film transistors TFT' may be disposed between the common electrode signal wiring VL and the first side edge 300N_S1 of the notch 300N of the display panel 300, and the gate lines SL($i_2$+1) and SL($i_2$+2) may penetrate through the common electrode signal wiring VL toward right to couple the dummy thin film transistors TFT'. In addition, in some other embodiments, the common electrode signal wiring VL may not be disposed in the part of the peripheral area 320 between the first side edge 300N_S1 of the notch 300N of the display panel 300 and the first side edge 310N_S1 of the notch 310N of the active area 310.

Figure 6D:
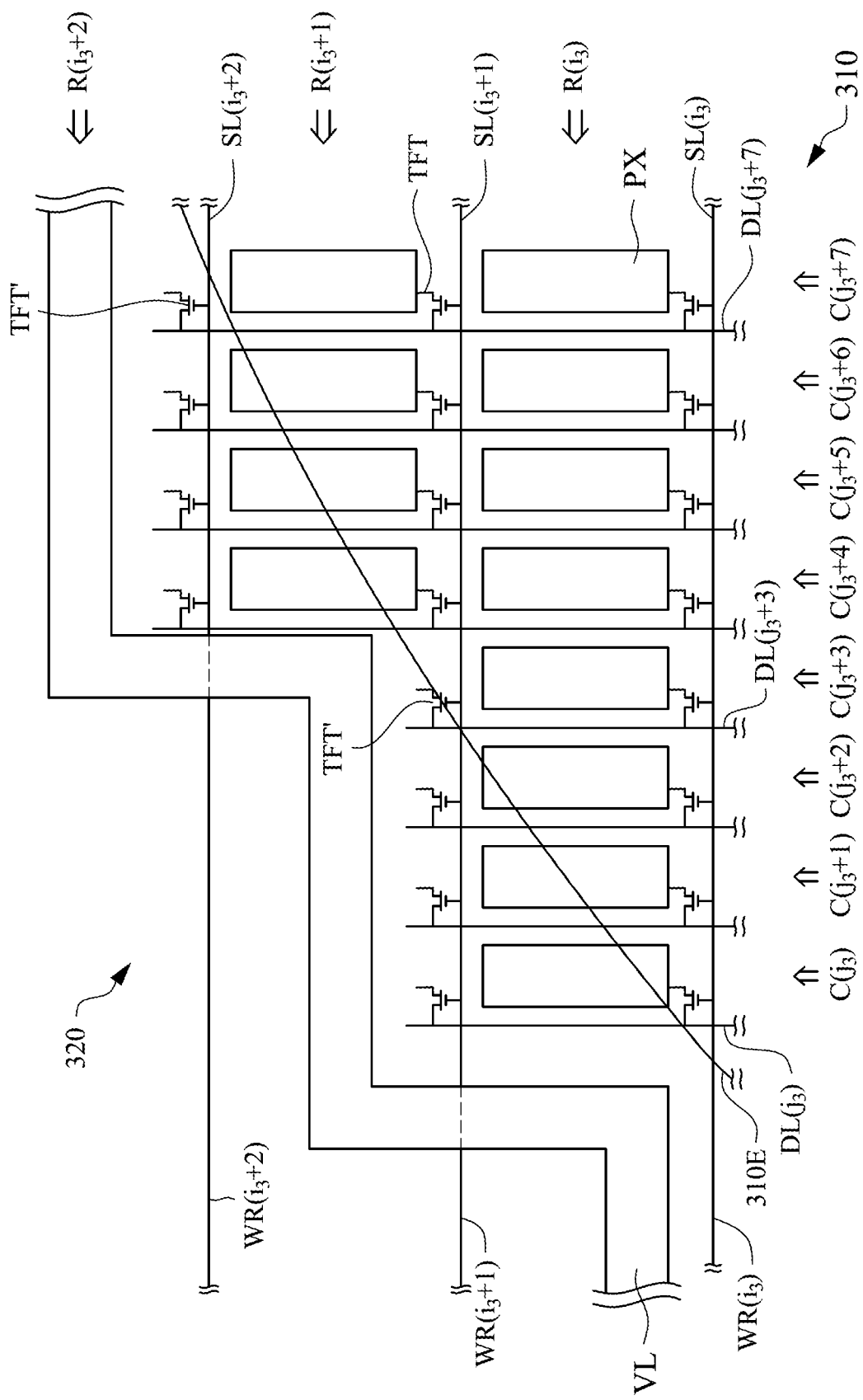

FIG. 6D illustrates pixel unit and component arrangements in a part of the subareas 310U2 of the active area 310 corresponding to the area D in FIG. 5. As shown in FIG. 6D, in the subarea 310U2 of the active area 310, the number of pixel units in the upper pixel row is less than or equal to the number of pixel units in the lower pixel row. For example, as shown in FIG. 6D, the number of pixel units in the pixel row R($i_3$+1) is less than the number of pixel units in the pixel row R($i_3$). However, the invention is not limited thereto. In variant embodiments, the numbers of pixels from lower to upper pixel rows in the subarea 310U2 may be sequentially decreasing, sequentially increasing, identical to each other, or irregularly changing.

Similar to the arrangement of the dummy thin film transistors shown in FIG. 6C, the dummy thin film transistors TFT' are disposed in the peripheral area 320 and near the third side edge 310N_S3 of the notch 310N of the active area 310, and are coupled to as least some of the gate lines SL(N'+1)-SL(N), so as to compensate the parasitic capacitors of at least some of the gate lines SL(N'+1)-SL(N). For example, each of the intersections of the gate line SL($i_3$+1) and the data lines DL($j_3$)-DL($j_3$+3) and the intersections of the gate line SL($i_3$+2) and the data lines DL($j_3$+4)-DL($j_3$+7) is coupled to a dummy thin film transistor TFT', so as to compensate the parasitic capacitors on the gate lines SL($i_3$+1) and SL($i_3$+2). In addition, in the embodiment of FIG. 6D, the edge 310E of the active area 310 shown in FIG. 6D is the third side edge 310N_S3 of the notch 310N of the active area 310 shown in FIG. 5, and therefore the common electrode signal wiring VL is disposed between the third side edge 300N_S3 of the notch 300N of the display panel 300 and the third side edge 310N_S3 of the notch 310N of the active area 310, and the dummy thin film transistors TFT' are disposed between the pixel units near the third side edge 310N_S3 of the notch 310N of the active area 310 and the common electrode signal wiring VL. However, the invention is not limited thereto. In variant embodiments, the dummy thin film transistors TFT' may be disposed between the common electrode signal wiring VL and the third side edge 300N_S3 of the notch 300N of the display panel 300, and the gate lines SL($i_3$+1) and SL($i_3$+2) may penetrate through the common electrode signal wiring VL toward left to couple the dummy thin film transistors TFT'. In addition, in some other embodiments, the common electrode signal wiring VL may not be disposed in the part of the peripheral area 320 between the third side edge 300N_S3 of the notch 300N of the display panel 300 and the third side edge 310N_S3 of the notch 310N of the active area 310.

The combination of FIG. 6B to FIG. 6D illustrates pixel unit arrangements in various parts of the irregular region 310U of the active area 310 and gate line arrangements in various parts of the gap 310S between the subareas 310U1 and 310U2. In addition, each of the gate lines SL(N'+1)-SL(N) include first to third portions respectively in the subarea 310U1, the gap 310S and the subarea 310U2, in which the first portion and the third portion are respectively in the subareas 310U1 and 310U2, and the second portion is in the gap 310S (or the notch 310N) between the subareas 310U1 and 310U2. The two terminals of the second portions of the gate lines SL(N'+1)-SL(N) are respectively coupled to the first portions and the third portions of the corresponding gate lines SL(N'+1)-SL(N) in the subareas 310U1 and 310U2. In the context, the second portions of the gate lines SL(N'+1)-SL(N) may also be referred to as wirings WR(N'+1)-WR(N), and thus the gate lines SL(N'+1)-SL(N) in FIG. 6B may also be labeled as WR(N'+1)-WR(N). The second portion of at least one of the gate lines SL(N'+1)-SL(N) is coupled to the dummy thin film transistors TFT' that are disposed in the gap 310S (or the notch 310N) between the subareas 310U1 and 310U2. Preferably, the dummy thin film transistors TFT' are disposed in at least one of an area of the gap 310S (or the notch 310N) near the left side of the gap 310S (i.e. near the right side edge of the subarea 310U1), an area of the gap 310S (or the notch 310N) near the right side of the gap 310S (i.e. near the left side edge of the subarea 310U2) and an area of the gap 310S (or the notch 310N) near the lower side of the gap 310S (i.e. near a portion of the upper side edge of the rectangular region 310L), but is not limited thereto. For example, the dummy thin film transistors TFT' may be in two areas of the gap 310S (or the notch 310N) between the subareas 310U1 and 310U2 and respectively near the left side and the right side of the gap 310S, or in three areas of the gap 310S (or the notch 310N) between the subareas 310U1 and 310U2 and respectively near the left side, the right side and the lower side of the gap 310S. As shown in FIG. 6B to FIG. 6D, the common electrode signal wiring VL is disposed between the edge 300E of the display panel 300 and the edge 310E of the active area 310. In other words, the common electrode signal wiring VL is disposed in the peripheral area 320 and between the side edges (including the first to third side edges 300N_S1, 300N_S2 and 300N_S3) of the notch 300N of the display panel 300 and the side edges (including the first to third side edges 310N_S1, 310N_S2 and 310N_S3) of the notch 310N of the active area 310, and therefore, the dummy thin film transistor TFT' may be further disposed between the pixel units near the side edges of the notch 310N of the active area 310 and the common electrode signal wiring VL. In other words, the dummy thin film transistor TFT' may be further arranged in the peripheral area 320 and between the side edge (including the first to third side edges 310N_S1, 310N_S2 and 310N_S3) of the notch 310N of the active area 310 and the common electrode signal wiring VL, but is not limited thereto. In variant embodiments, the dummy thin film transistor TFT' may be disposed between the edge 300E of the display panel 300 and the common electrode signal wiring VL. In other words, the dummy thin film transistor TFT' may be arranged in the peripheral area 320 and between the side edges (including the first to third side edges 300N_S1, 300N_S2 and 300N_S3) of the notch 300N of the display panel 300 and the common electrode signal wiring VL. In addition, the numbers of coupled dummy thin film transistors of the gate lines SL(N'+1)-SL(N) may be different from each other, but is not limited thereto. In variant embodiments, at least some of the gate lines SL(N'+1)-SL(N) have the same number of coupled dummy thin film transistors. As shown in FIG. 6C, in the left half of the display panel 300, the first portions of the gate lines $SL(j_2+1)$ and $SL(j_2+2)$ in the subarea 310U1 extend into the gap 310S (or the notch 310N), respectively couple to the wirings $WR(i_2+1)$ and $WR(i_2+2)$ (the wirings $WR(i_2+1)$ and $WR(i_2+2)$ may be viewed as the second portions of the gate lines $SL(i_2+1)$ and $SL(i_2+2)$), and respectively couple to the third portions of the gate lines $SL(i_2+1)$ and $SL(i_2+2)$ in the subarea 310U2 in the right half of the display panel 300 (not shown); in the right half of the display panel 300, as shown in FIG. 6D, the third portions of the gate lines $SL(i_3+1)$ and $SL(i_3+2)$ in the subarea 310U2 extend into the gap 310S (or the notch 310N), respectively couple to the wirings $WR(i_3+1)$ and $WR(i_3+2)$ (the wirings $WR(i_3+1)$ and $WR(i_3+2)$ may be viewed as the second portions of the gate lines $SL(i_3+1)$ and $SL(i_3+2)$), and respectively couple the first portions of the gate lines $SL(i_3+1)$ and $SL(i_3+2)$ in the subarea 310U1 in the left half of the display panel 300 (not shown). Although not illustrated in FIG. 6C and FIG. 6D, it can be directly understood from the contents in FIG. 6B to FIG. 6D that, the first portions and the third portions of the others of the gate lines SL(N'+1)-SL(N) respectively in the subareas 310U1 and 310U2 may also couple to the others of the wirings WR(N'+1)-WR(N) in the gap 310S (or the notch 310N) correspondingly. In addition, in some embodiments, the widths of the wirings WR(N'+1)-WR(N) may be respectively the same as the widths of the first portion and the third portion of the corresponding gate lines in the active area 310 (i.e. the widths of the first portions and the third portions of the gate lines SL(N'+1)-SL(N) respectively in the subareas 310U1 and 310U2). However, the invention is not limited thereto. In some other embodiments, the widths of at least some of the wirings WR(N'+1)-WR(N) may be different from the widths of the first portion and the third portion of the corresponding gate lines in the active area 310 (i.e. the widths of the first portions and the third portions of the gate lines SL(N'+1)-SL(N) respectively in the subareas 310U1 and 310U2), so as to adjust the resistances of at least some of the gate lines SL(N'+1)-SL(N), but is not limited thereto. For example, the widths of the wirings $WR(i_2+1)$ and $WR(i_2+2)$ may be respectively larger than the widths of the first portions and the third portions of the gate lines $SL(i_2+1)$ and $SL(i_2+2)$ in the active area 310 for reducing the resistances of the gate lines $SL(i_2+1)$ and $SL(i_2+2)$. Because the top sides of the display panel 300 and the active area 310 respectively have the notches 300N, 310N, after the first portions of the gate lines SL(N'+1)-SL(N) extend from the subarea 310U1 into the gap 310S (of the notch 310N) to couple the corresponding wirings WR(N'+1)-WR(N), the wirings WR(N'+1)-WR(N) have to pass through the gap 310S (or the notch 310N) between the subareas 310U1 and 310U2 for extending into the subarea 310U2 to couple the third portions of the corresponding the gate line SL(N'+1)-SL(N), and therefore at least some of the wirings WR(N'+1)-WR(N) have different lengths. In particular, in some embodiments, at least some of the wirings WR(N'+1)-WR(N) have different widths for adjusting the resistances of the gate lines SL(N'+1)-SL(N), such that the resistive-capacitive loadings of the gate lines SL(N'+1)-SL(N) can be or the same or approximately the same.

Figure 7A:
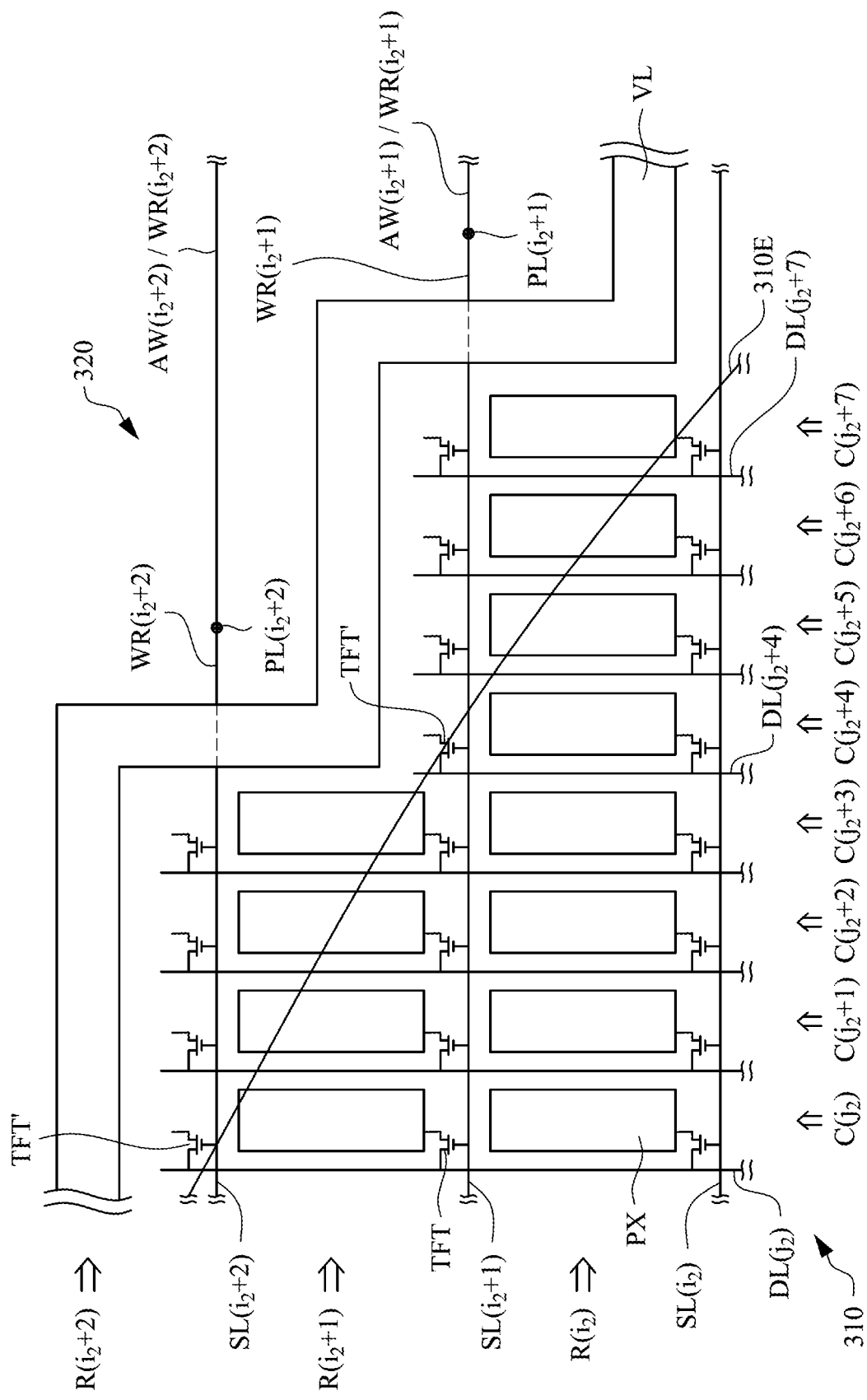
FIG. 7A to FIG. 7C are pixel unit and component arrangements in various regions of the active area in FIG. 3.
Figure 7B:
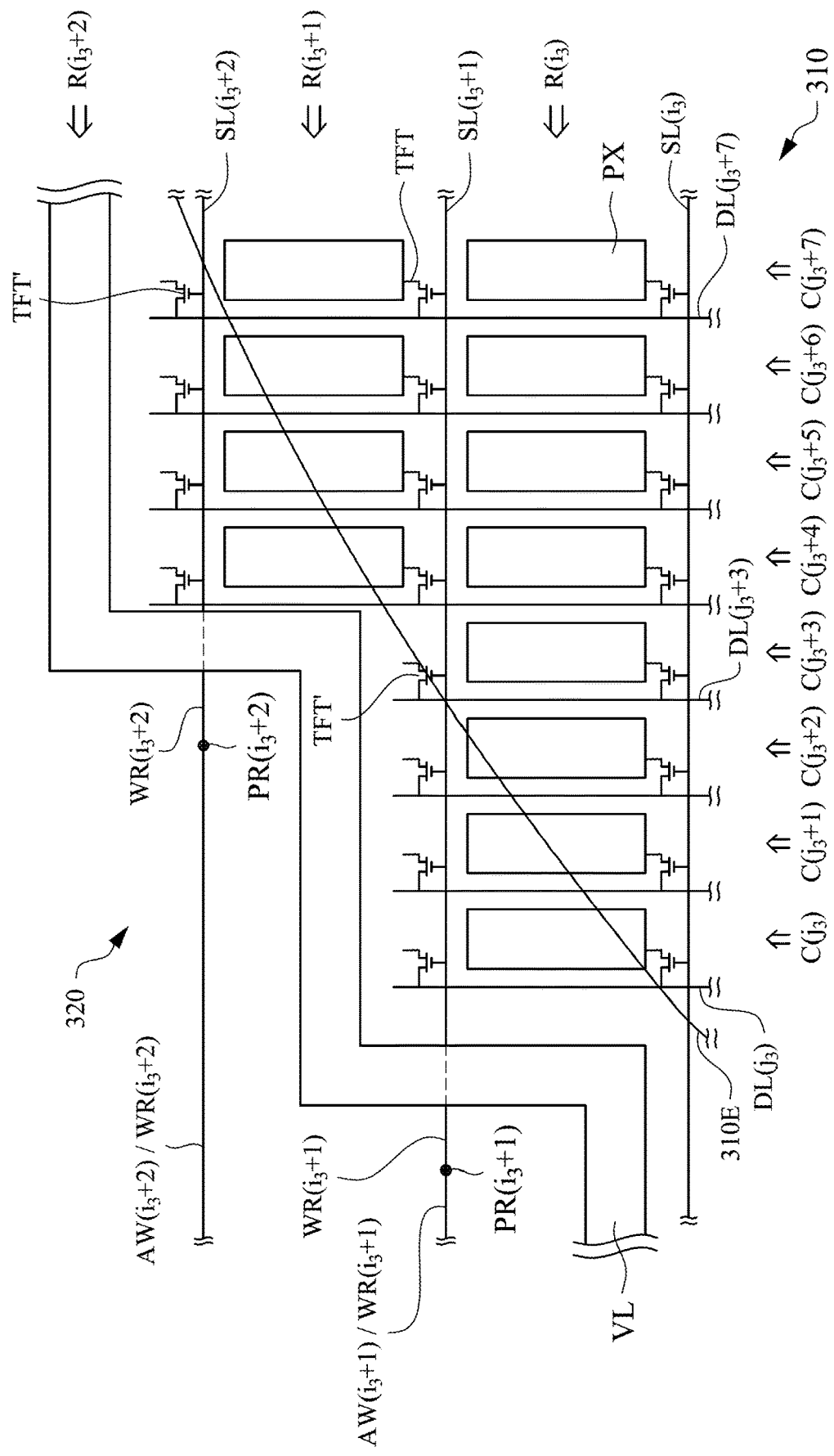
Figure 7C:
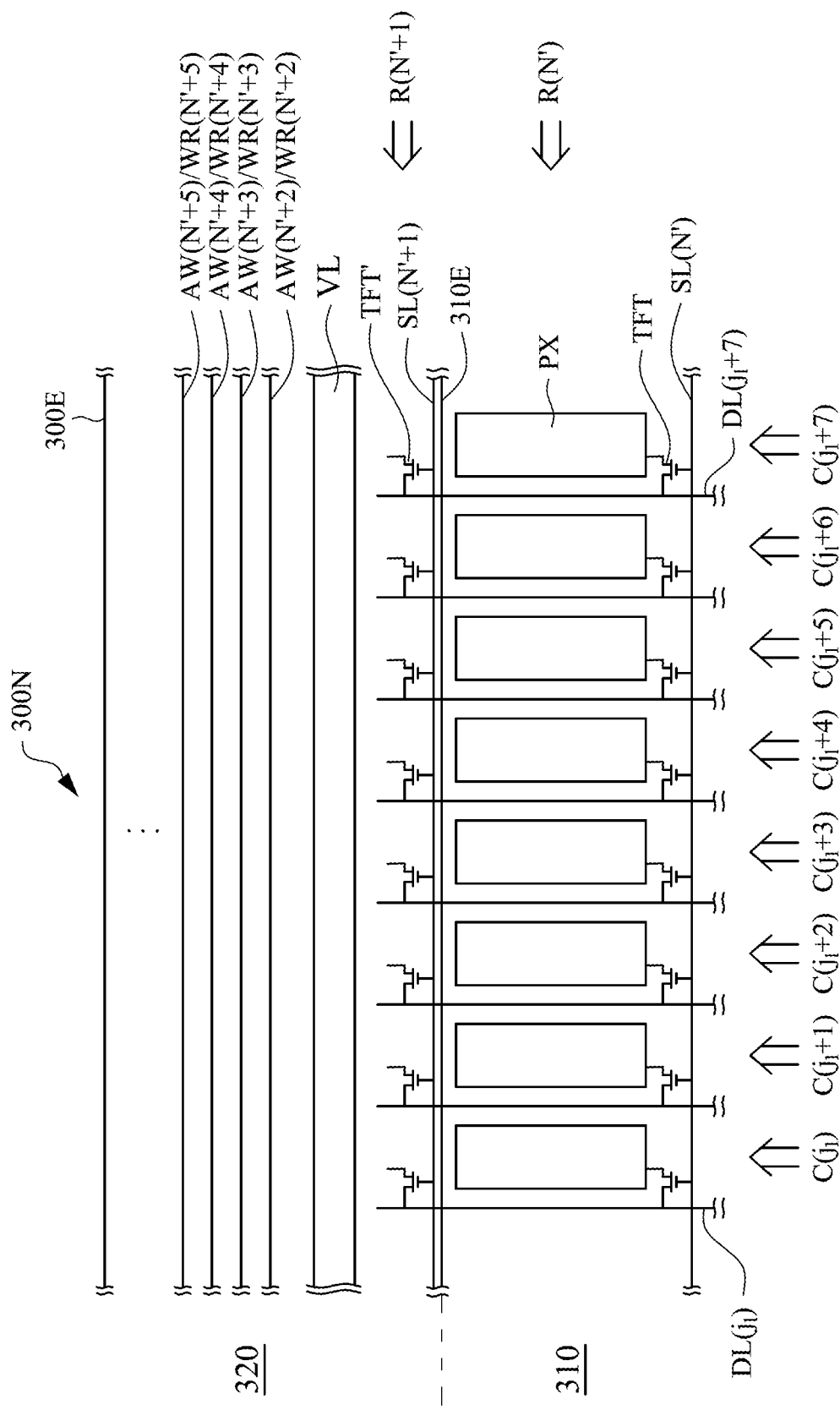

Referring to FIG. 7A, FIG. 7B and FIG. 7C, which illustrate pixel unit and component arrangements respectively in parts of the subareas 310U1 and 310U2 and the peripheral area 320 between the subareas 310U1 and 310U2 in the active area 310 in accordance with another embodiment. FIG. 7A, FIG. 7B and FIG. 7C are respectively similar to FIG. 6C, FIG. 6D and FIG. 6B; the different between two sets of figures is that, the second portions in FIG. 6A to FIG. 6C are single-layer wiring structures, while the second portions in FIG. 7A to FIG. 7C include double-layer wiring structures for reducing the resistances of the gate lines. For example, from the area in the left half of the display panel 300 near the subarea 310U1, as shown FIG. 7A, the second portion of the gate line $SL(i_2+1)$ includes wirings $WR(i_2+1)$ and $AW(i_2+1)$, and the second portion of the gate line $SL(i_2+2)$ includes wirings $WR(i_2+2)$ and $AW(i_2+2)$. In the context, the wirings $WR(i_2+1)$ and $WR(i_2+2)$ may also be referred to as first wirings, and the wirings AW($i_2$+1) and AW($i_2$+2) may also be referred to as second wirings. The second wirings AW($i_2$+1) and AW($i_2$+2) are partially overlapped with the first wirings WR($i_2$+1) and WR($i_2$+2), respectively, so as to form double-layer wiring structures AW($i_2$+1)/WR($i_2$+1) and AW($i_2$+2)/WR($i_2$+2). In FIG. 7A, the wirings WR($i_2$+1) and WR($i_2$+2) extend in the gap 310S (or the notch 310N) for a certain length to form double-layer wiring structures respectively with the wirings AW($i_2$+1) and AW($i_2$+2). In other words, a portion of the second portion of the gate line SL($i_2$+1) and a portion of the second portion of the gate line SL($i_2$+2) are double-layer wiring structures. However, the invention is not limited thereto. In variant embodiments, the wirings WR($i_2$+1) and WR($i_2$+2) may be respectively overlapped with the wirings AW($i_2$+1) and AW($i_2$+2) at the side edge of the gap 310S (or the notch 310N) to form double-layer wiring structures, i.e., all the second portions of the gate lines SL($i_2$+1) and SL($i_2$+2) may be double-layer wiring structures. In summary, at least a portion of the second portion of the gate line is a double-layer wiring structure. Each double-layer wiring structure includes an upper wiring and a lower wiring formed from different conductive layers. For example, the lower wiring and the upper wiring of the double-layer wiring structure AW($i_2$+1)/WR($i_2$+1) may be one or the other of the wiring AW($i_2$+1) and at least a portion of the wiring WR($i_2$+1), respectively, and may be formed from different conductive layers (e.g. metal layers). The wirings AW($i_2$+1) and AW($i_2$+2) are respectively electrically connected to the wiring WR($i_2$+1) through the connection point PL($i_2$+1) and the wiring WR($i_2$+2) through the connection point PL($i_2$+2), and the wirings AW($i_2$+1) and AW($i_2$+2) are also respectively electrically connected to the wiring WR($i_2$+1) through one connection point and the wiring WR($i_2$+2) through another connection point in the right half of the display panel 300 (not shown). As such, the upper wiring and the lower wiring of each of the double-layer wiring structures AW($i_2$+1)/WR($i_2$+1) and AW($i_2$+2)/WR($i_2$+2) are arranged in parallel connection, and the resistances of the gate lines SL($I_2$+1) and SL($i_2$+2) are reduced accordingly. In the area in the right half of the display panel 300 near the subarea 310U2, as shown in FIG. 7B, the gate line SL($i_3$+1) includes the wirings WR($i_3$+1) and AW($i_3$+1), and the gate line SL($i_3$+2) includes the wirings WR($i_3$+2) and AW($i_3$+2), in which the wirings AW($i_3$+1), AW($i_3$+2) are partially overlapped with the first wirings WR($i_3$+1) and WR($i_3$+2), respectively, so as to form double-layer wiring structures AW($i_3$+1)/WR($i_3$+1) and AW($i_3$+2)/WR($i_3$+2). The wirings AW($i_3$+1) and AW($i_3$+2) are respectively electrically connected to the wiring WR($i_3$+1) through the connection point PR($i_3$+1) and the wiring WR($i_3$+2) through the connection point PR($i_3$+2), and the wirings AW($i_3$+1) and AW($i_3$+2) are also respectively electrically connected to the wiring WR($i_3$+1) through a connection point and the wiring WR($i_3$+2) through another connection point in the left half of the display panel 300. As such, the upper wiring and the lower wiring of each of the double-layer wiring structures AW($i_3$+1)/WR($i_3$+1) and AW($i_3$+2)/WR($i_3$+2) are arranged in parallel connection, and the resistances of the gate lines SL($i_3$+1) and SL($i_3$+2) are reduced accordingly. From the bottom near the notch 310N of the active area 310, as shown in FIG. 7C, the wirings AW(N'+2)-AW(N'+5) are at least partially overlapped with the wirings WR(N'+2)-WR(N'+5), respectively, so as to form double-layer wiring structures AW(N'+2)/WR(N'+2)-AW(N'+5)/WR(N'+5), and the wirings AW(N'+2)-AW(N'+5) are respectively coupled to the wirings WR(N'+2)-WR(N'+5) through connection points in an area near the subarea 310U1 in the left half of the display panel 300 and in an area near the subarea 310U2 in the right half of the display panel 300. As such, the upper wiring and the lower wiring of each of the double-layer wiring structures AW(N'+2)/WR(N'+2)-AW(N'+5)/WR(N'+5) are arranged in parallel connection, and the resistances of the gate line SL(N'+2)-SL(N'+5) are reduced accordingly. It is noted that, in the embodiment of FIG. 7C, the second portion of the gate line SL(N'+1) includes a single-layer wiring structure However, the invention is not limited thereto. In variant embodiments, the second portion of the gate line SL(N'+1) may include a double-layer wiring structure. In the foregoing embodiment, the upper wiring and the lower wiring of each double-layer wiring structure may at least partially overlapped in the direction perpendicular to the substrate 302; that is, each double-layer wiring structure includes a lower wiring and an upper wiring stacked on the lower wiring for shrinking its occupied area. However, the invention is not limited thereto. In variant embodiments, the upper wiring and the lower wiring of the double-layer wiring structure may be non-overlapped (e.g. parallel with each other when viewed in the direction perpendicular to the substrate 302), and the two opposite terminals of the upper wiring are coupled to the correspondingly lower wiring through connection points, so as to form an arrangement of parallel connection.

Figure 8A:
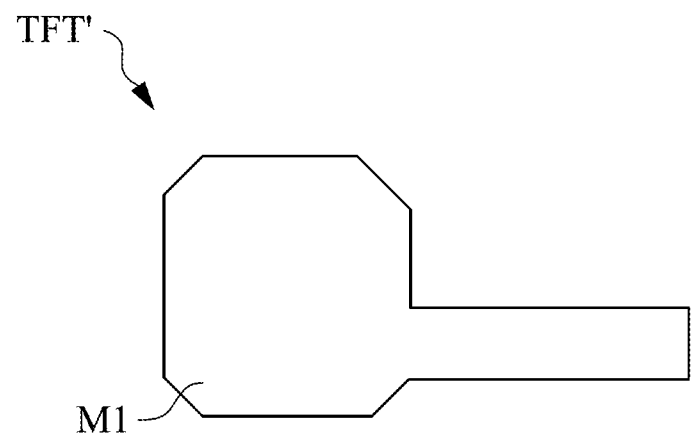
FIG. 8A to FIG. 8E are various stages of schematic layout diagrams for forming a thin film transistor and a dummy thin film transistor in accordance with some embodiments of the invention.
Figure 8A:
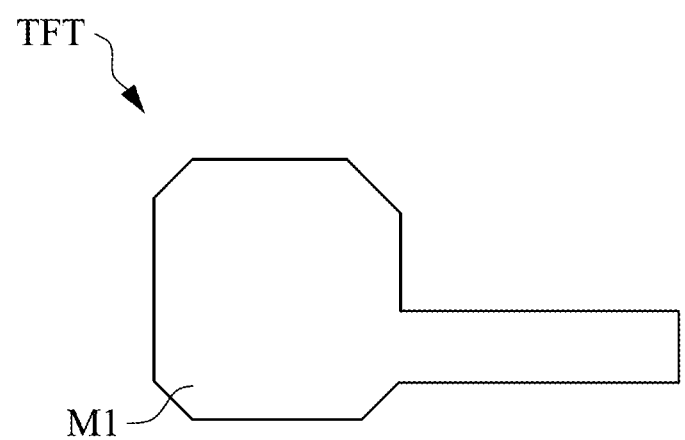

FIG. 8A to FIG. 8E are various stages of schematic layout diagrams for forming a pixel unit in accordance with some embodiments of the invention. The schematic layout diagrams of the thin film transistor TFT and the dummy thin film transistor TFT' are shown in FIG. 8A to FIG. 8E. First, as shown in FIG. 8A, metal is deposited on the substrate (not shown in FIG. 8A), and then lithographic and etching processes are performed on the deposited metal, so as to form a metal layer M1 that includes the gates of the thin film transistor TFT and the dummy thin film transistor TFT' and the scan lines. The material for forming the metal layer M1 may include a metal element such as chromium, tungsten, tantalum, titanium, molybdenum, aluminum, copper or another similar element, or a metal alloy or a compound formed of any combination of the above metal elements, but is not limited thereto.

Figure 8B:
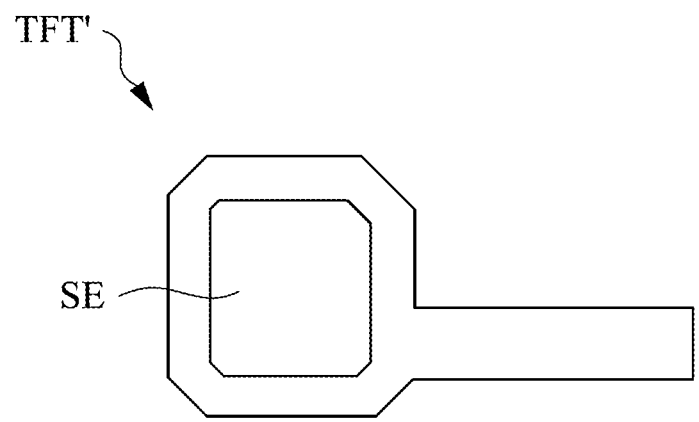
Figure 8B:
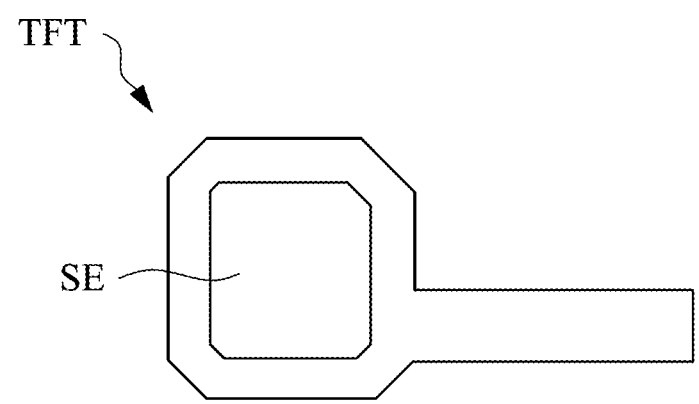

Then, as shown in FIG. 8B, a gate insulating layer (also referred to as a first insulating layer) (not shown in FIG. 8B and FIG. 8E) is formed on the substrate (not shown in FIG. 8B) and the metal layer M1, and subsequently a semiconductor layer SE is formed on the gate insulating layer and at least partially overlapped with the gates of the thin film transistor TFT and the dummy thin film transistor TFT'. The gate insulating layer may extend from the active area 310 to the peripheral area 320 and cover the metal layer M1, but is not limited thereto. The material of the gate insulating layer may be silicon nitride or another similar material, and the material of the semiconductor layer SE may be amorphous silicon, polycrystalline silicon, monocrystalline silicon or another similar material.

Figure 8C:
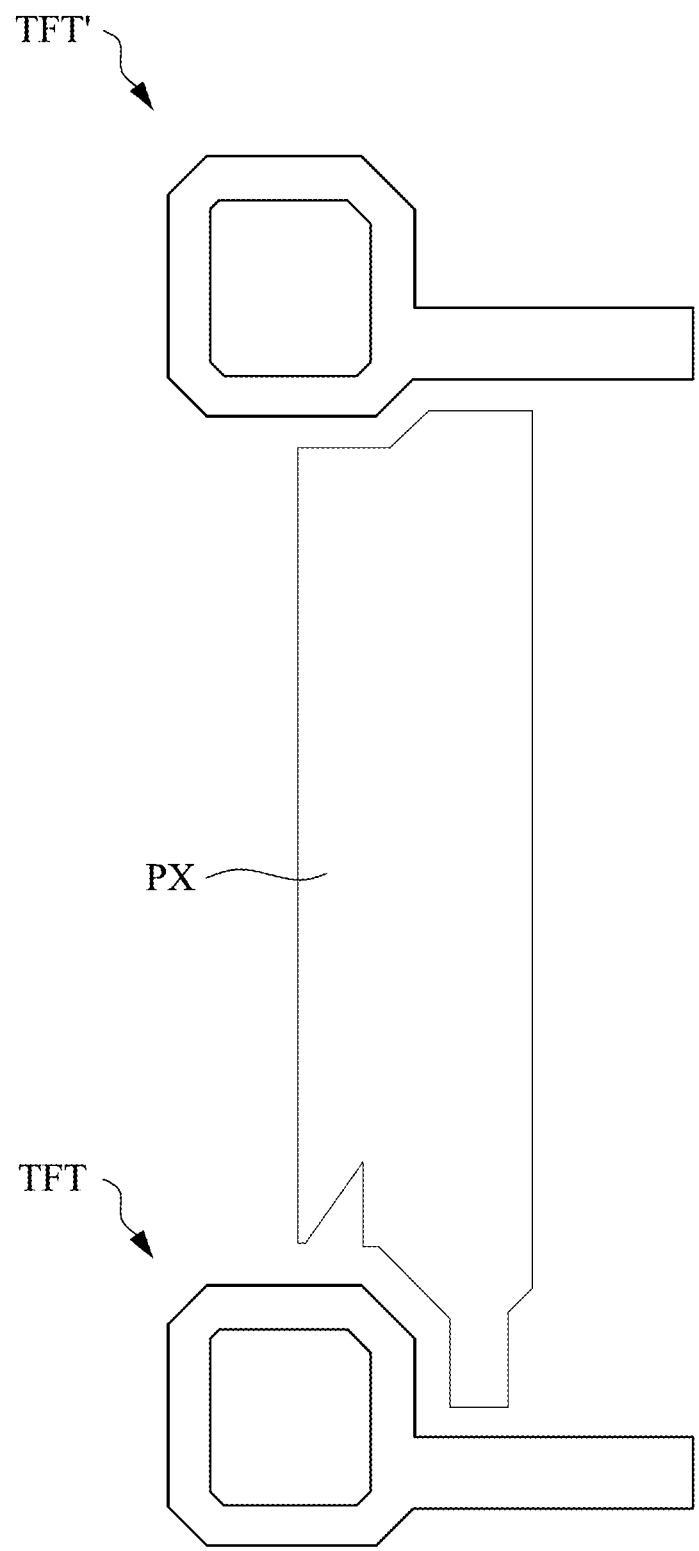

Afterwards, as shown in FIG. 8C, a pixel electrode PX is formed in the pixel unit including the thin film transistor TFT. The material for forming the pixel electrode PX may be, for example, indium tin oxide (ITO), indium zinc oxide (IZO), indium oxide, tin oxide or another suitable transparent conductive material. It is noted that, the dummy thin film transistor TFT' is merely used for compensating the resistance and the capacitance of a gate line rather than for image display, i.e., the dummy thin film transistor TFT' does not belong to any pixel unit, and therefore no pixel electrode corresponding to the dummy thin film transistor TFT' is formed.

Figure 8D:
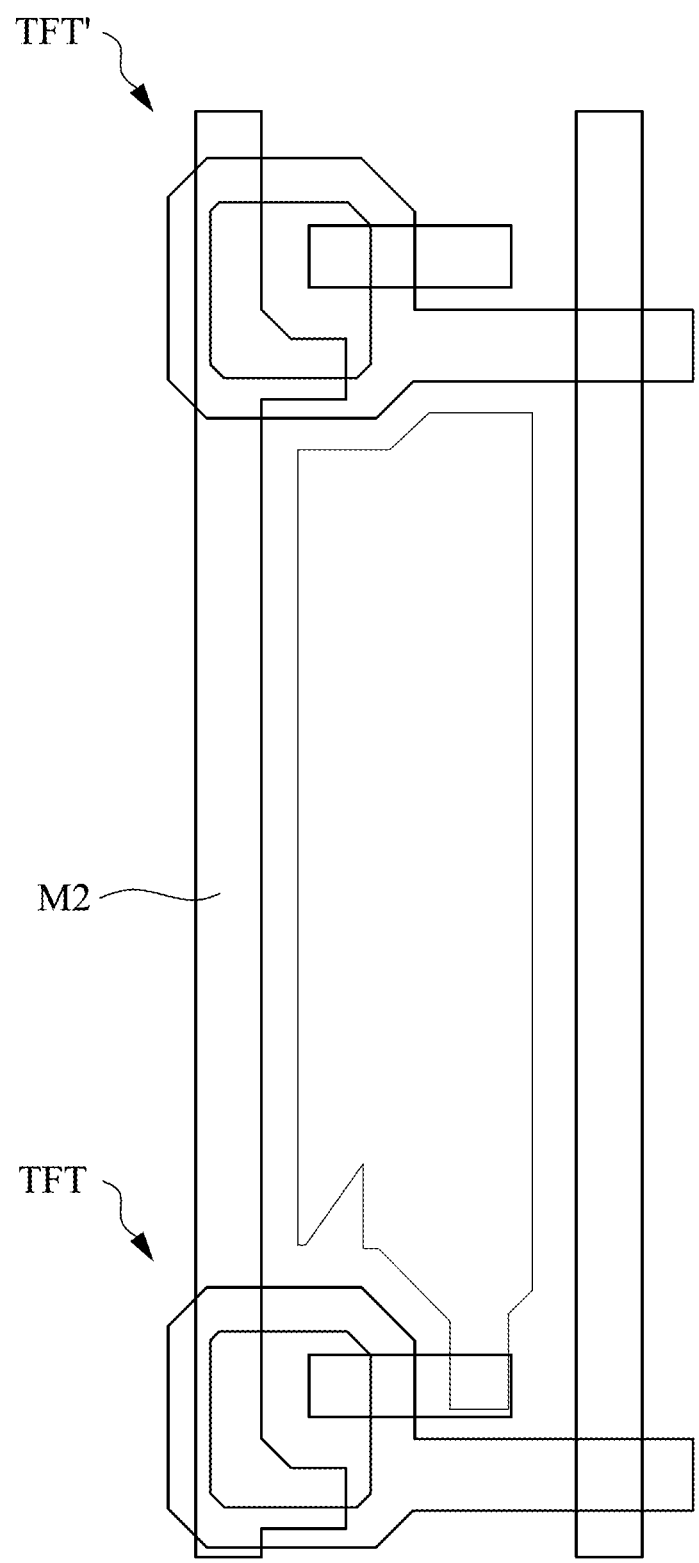

Then, as shown in FIG. 8D, metal is deposited on the gate insulating layer, the metal layer M1, the semiconductor layer SE and the pixel electrode PX, and then an etching process is performed on the deposited metal, so as to form a metal layer M2 that includes the sources and the drains of the thin film transistor TFT and the dummy thin film transistor TFT', and the drain of the film transistor TFT contacts a portion of the pixel electrode PX. The material for forming the metal layer M2 may include a metal element such as chromium, tungsten, tantalum, titanium, molybdenum, aluminum, copper or another similar element, or a metal alloy or a compound formed of any combination of the above metal elements, but is not limited thereto.

Figure 8E:
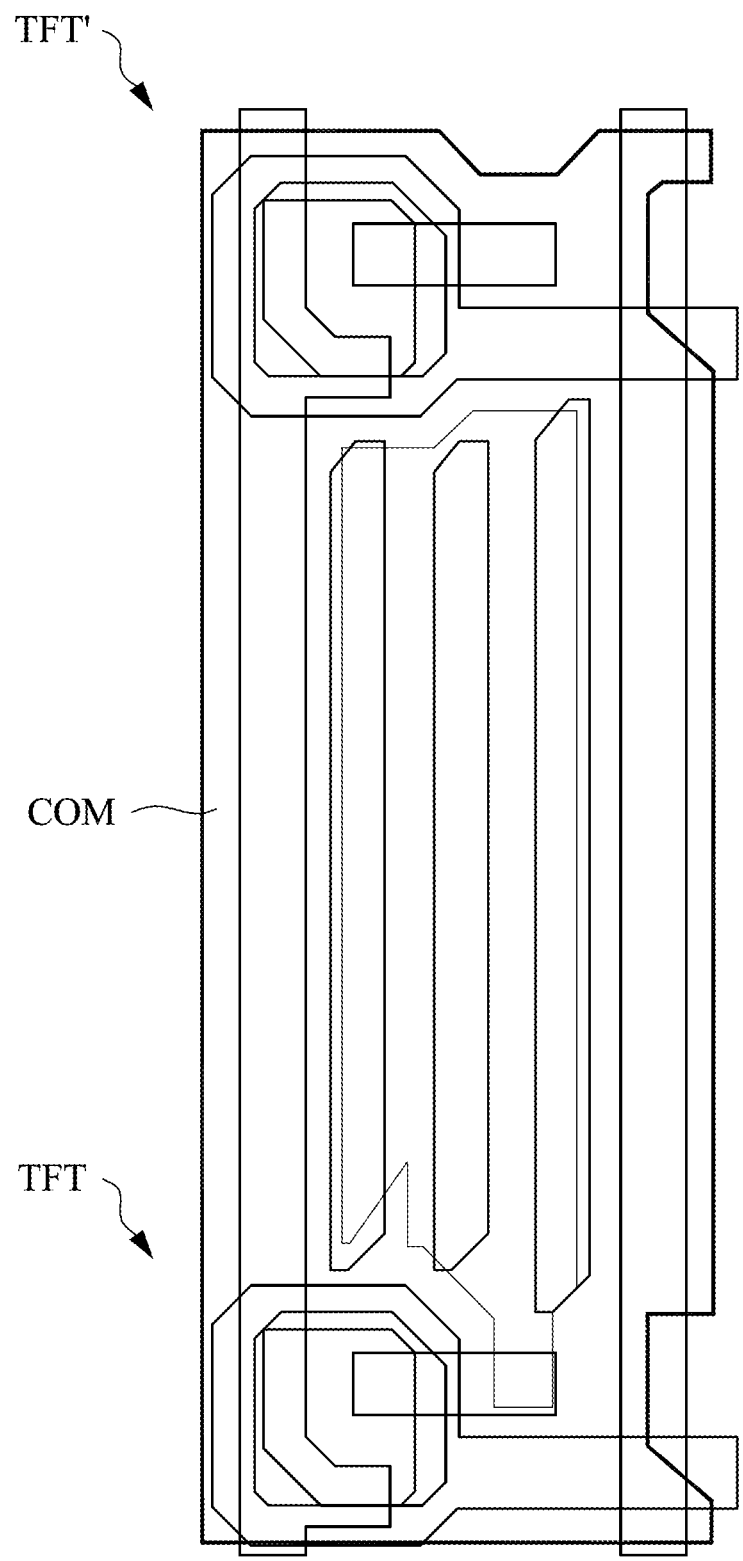

Then, as shown in FIG. 8E, a protective layer (also referred to as a second insulating layer) (not shown in FIG. 8E) is formed on the metal layer M2, the semiconductor layer SE and the pixel electrode PX, and then a common electrode COM having at least one slit is formed on the protective layer. The protective layer extends from the active area 310 to the peripheral area 320, and covers the thin film transistor TFT, the dummy thin film transistor TFT', the data line and the gate line, but is not limited thereto. The material of the protective layer may be silicon oxide, silicon nitride, silicon oxynitride or another similar material. The electrical field between the common electrode COM and the pixel electrode PX controls rotation of the liquid crystal molecules. Similarly, the material of the common electrode COM may be, for example, ITO, IZO, indium oxide, tin oxide or another suitable transparent conductive material.

It is noted that, the pixel unit in FIG. 8A to FIG. 8E is exemplified by a pixel unit of an FFS type display panel in which the pixel electrode is below the common electrode, but the invention is not limited thereto. Embodiments of the invention may also be applied to display panels of another type. For illustration, the display panel may be, for example, a liquid crystal display of TN type, IPS type, FFS type (in which the common electrode is below the pixel electrode), VA type, reflective type or transflective type, or an OLED display panel, but is not limited thereto.

Figure 9A:
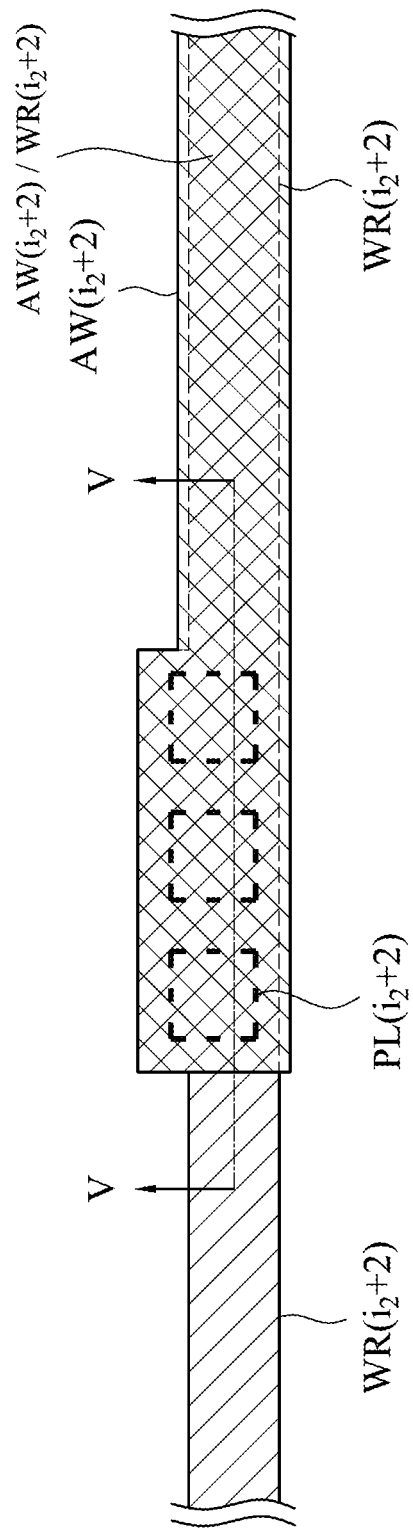
FIG. 9A is a schematic layout diagram of a double-layer wiring structure in accordance with some embodiments of the invention.
Figure 9B:
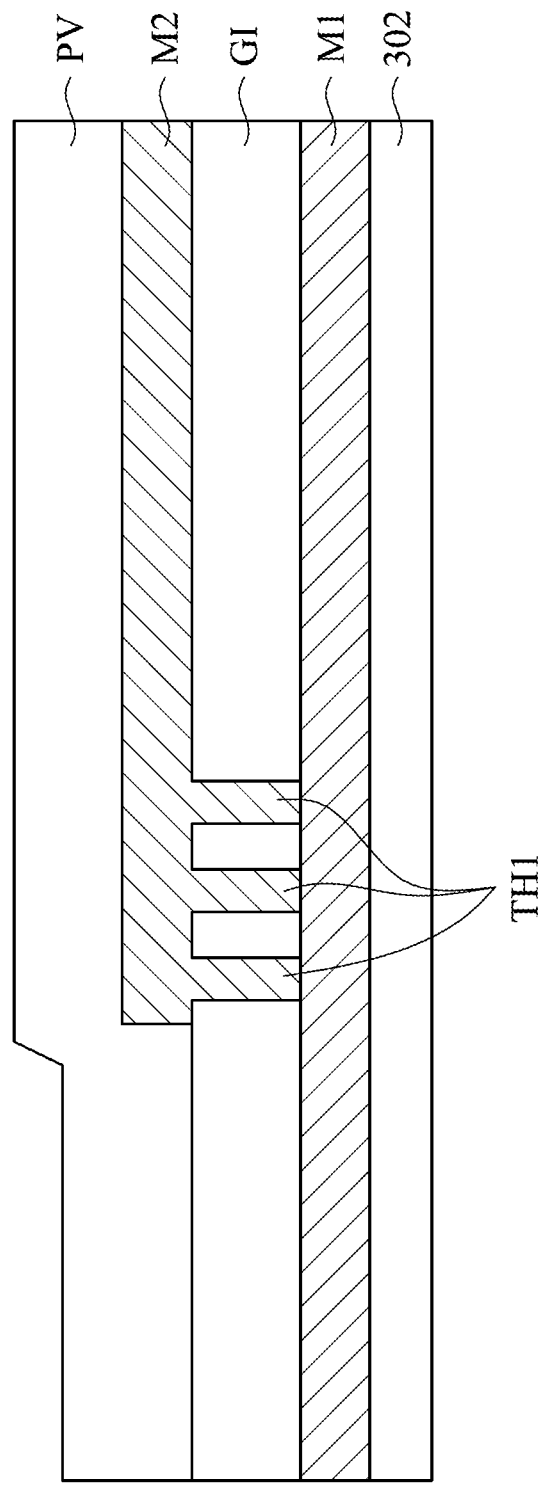
FIG. 9B is a cross-sectional view of a part of the layout viewed a V-V line of FIG. 9A.

In some embodiments, the upper wiring and the lower wiring of the double-layer wiring structure may be at least partially overlapped in the direction perpendicular to the substrate 302 for shrinking the occupied area of the double-layer wiring structure. For example, as shown in FIG. 7A, the wirings $AW(i_2+1)$ and a portion of the wirings $WR(i_2+1)$ may be overlapped in the direction perpendicular to the substrate 302. FIG. 9A is a layout diagram of a double-layer wiring structure in accordance with some embodiments of the invention, and FIG. 9B is a cross-sectional view of the layout diagram viewed along a V-V line of FIG. 9A. It is noted that, FIG. 9A is exemplified by the double-layer wiring structure $AW(i_2+1)/WR(i_2+1)$ in FIG. 7A, but is not limited thereto. The layout pattern in FIG. 9A and the cross-sectional structure in FIG. 9B may similarly be applied to the double-layer wiring structures of the other gate lines in the gap 310S (or the notch 310N) between the subareas 310U1, 310U2. In FIG. 9A and FIG. 9B, the wirings $WR(i_2+1)$ and $AW(i_2+1)$ respectively belong to the metal layers M1, M2, the gate insulating layer GI covers the metal layer M1, and the through-holes TH1 penetrate through the gate insulating layer GI, and therefore the metal layer M2 may fill the through-holes TH1 to contact the metal layer M1, such that the metal layers M1 and M2 are electrically connected with each other, i.e., the wirings $WR(i_2+1)$ and $AW(i_2+1)$ are electrically connected with each other. The protective layer PV covers the metal layer M2. Also referring to FIG. 7A, taking the gate line $SL(i_2+1)$ as an example for explanation, the wiring $WR(i_2+1)$ and $AW(i_2+1)$ belong to the metal layers M1, M2 respectively, and the connection point $PL(i_2+1)$ corresponds to the through-holes TH1. In summary, the double-layer wiring structure of the gate line includes an upper wiring and a lower wiring, an insulating layer (e.g. the gate insulating layer GI) is between the upper wiring and the lower wiring and has multiple through-holes (e.g. the through-holes TH1). Each of the through-holes exposes a portion of the lower wiring and is overlapped with a portion of the upper wiring (e.g. one of the two opposite terminals of the upper wiring) in the direction perpendicular to the substrate 302, and the upper wiring is electrically connected to the lower wiring through the through-holes. It is noted that, the layout diagram and the cross-sectional view of the double-layer wiring structure illustrated in FIG. 9A and FIG. 9B are merely illustrative examples, and are not intended to limit the scope of the invention. For example, in some other embodiments, one terminal of the upper wiring may be electrically connected to the lower wiring through a bridge electrode, and the other terminal of the upper wiring may be electrically connected to the lower wiring through another bridge electrode, so as to form a double-layer wiring structure. One of the bridge electrodes is electrically connected to one terminal of the upper wiring and the lower wiring respectively through two through-holes that are respectively formed in at least one insulating layer covering the upper wiring and at least one insulating layer covering the lower wiring, and expose one terminal of the upper wiring and the lower wiring respectively. The other of the bridge electrodes is electrically connected to the other terminal of the upper wiring and the lower wiring through other two through-holes that are respectively formed in at least one insulating layer covering the upper wiring and at least one insulating layer covering the lower wiring and respectively expose the other terminal of the upper wiring and the lower wiring, but is not limited thereto.

In the embodiments of FIG. 8A to FIG. 9B, the thin film transistor TFT and the dummy thin film transistor TFT' are bottom-gate structures; the wirings WR(N'+2)-WR(N) and the gate of each of the thin film transistor TFT and the dummy thin film transistor TFT' in the display panel 300 belong to the metal layer M1, while the wirings AW(N'+2)-AW(N) and the source and drain of each of the thin film transistor TFT and the dummy thin film transistor TFT' in the display panel 300 belong to the metal layer M2, but is not limited thereto. That is, the wirings WR(N'+2)-WR(N) and the gate of each of the thin film transistor TFT and the dummy thin film transistor TFT' may be simultaneously formed by the same process, and the wirings AW(N'+2)-AW(N) and the source and drain of each of the thin film transistor TFT and the dummy thin film transistor TFT' in the display panel 300 may be simultaneously by the same process. In some other embodiments, the thin film transistor TFT and the dummy thin film transistor TFT' are top-gate structures; the wirings AW(N'+2)-AW(N) and the source and the drain of each of the thin film transistors TFT and the dummy thin film transistors TFT' in the display panel 300 belong to the metal layer M1, while the wirings WR(N'+2)-WR(N) and the gate of each of the thin film transistors TFT and the dummy thin film transistors TFT' in the display panel 300 belong to the metal layer M2.

In addition, the wirings WR(N'+2)-WR(N) and AW(N'+2)-AW(N) and the electrical components in the gate driving circuit 330 may be formed simultaneously. For example, the wirings WR(N'+2)-WR(N) and the gates of the transistors in the shift registers 332(1)-332(N) may be formed simultaneously, and the auxiliary wirings AW(N'+2)-AW(N) and the sources and drains of the transistors in the shift registers 332(1)-332(N) may be formed simultaneously.

Figure 10:
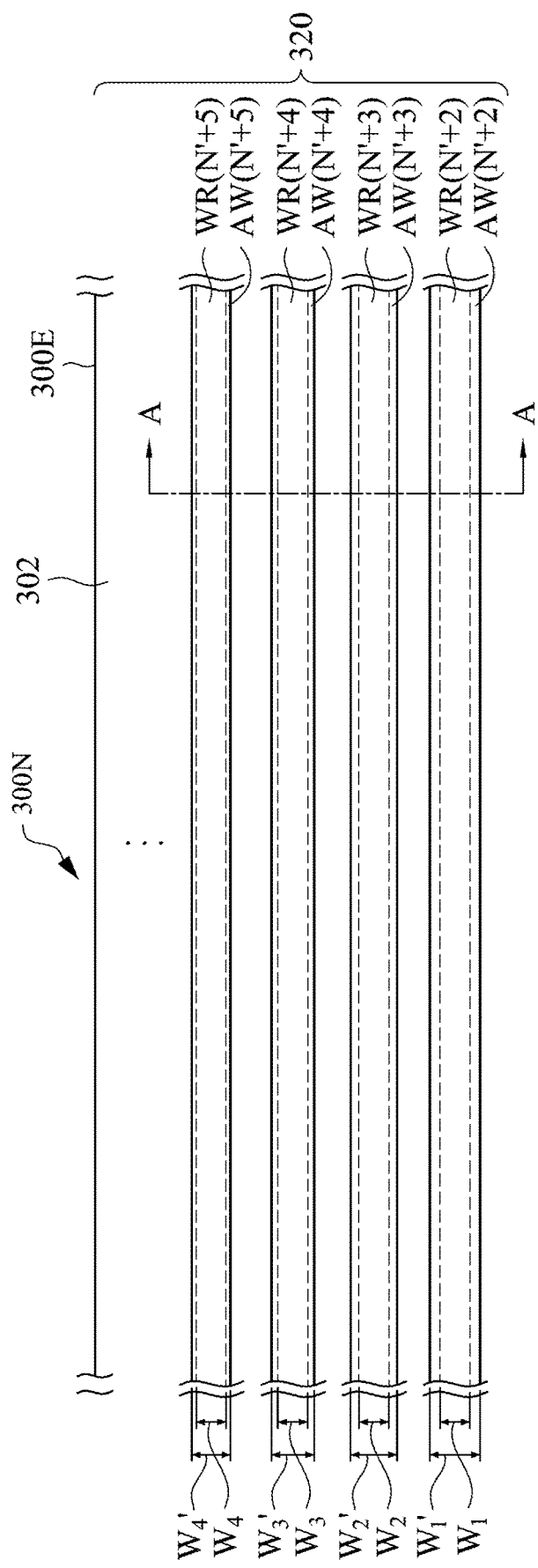
FIG. 10 is a partial layout diagram of some wirings and auxiliary wirings in the peripheral area between the irregular region and the notch region shown in FIG. 3.

FIG. 10 is a partial layout diagram of the wirings WR(N'+2)-WR(N'+5) and the wirings AW(N'+2)-AW(N'+5) in the gap 310S (or the notch 310N) between the subareas 310U1, 310U2 corresponding to the position of the gate lines SL(N'+2)-SL(N'+5) in FIG. 6B. In other words, FIG. 10 may be viewed as substituting at least a portion of the second portions of the gate lines SL(N'+2)-SL(N'+5) in FIG. 6B (i.e. the wirings WR(N'+2)-WR(N'+5)) with the double-layer wiring structures AW(N'+2)/WR(N'+2)-AW(N'+5)/WR(N'+5). In particular, the double-layer wiring structures AW(N'+2)/WR(N'+2)-AW(N'+5)/WR(N'+5) are respectively portions of the gate lines SL(N'+2)-SL(N'+5). In FIG. 10, the wirings AW(N'+2)-AW(N'+5) respectively cover the wirings WR(N'+2)-WR(N'+5) in the direction perpendicular to the substrate 302, and therefore the wirings WR(N'+2)-WR(N'+5) are illustrated by dashed lines, in which the wirings WR(N'+2)-WR(N'+5) respectively have widths $W_1$-$W_4$ while the wirings AW(N'+2)-AW(N'+5) respectively have widths $W_{1'}$-$W_{4'}$.

Figure 11:
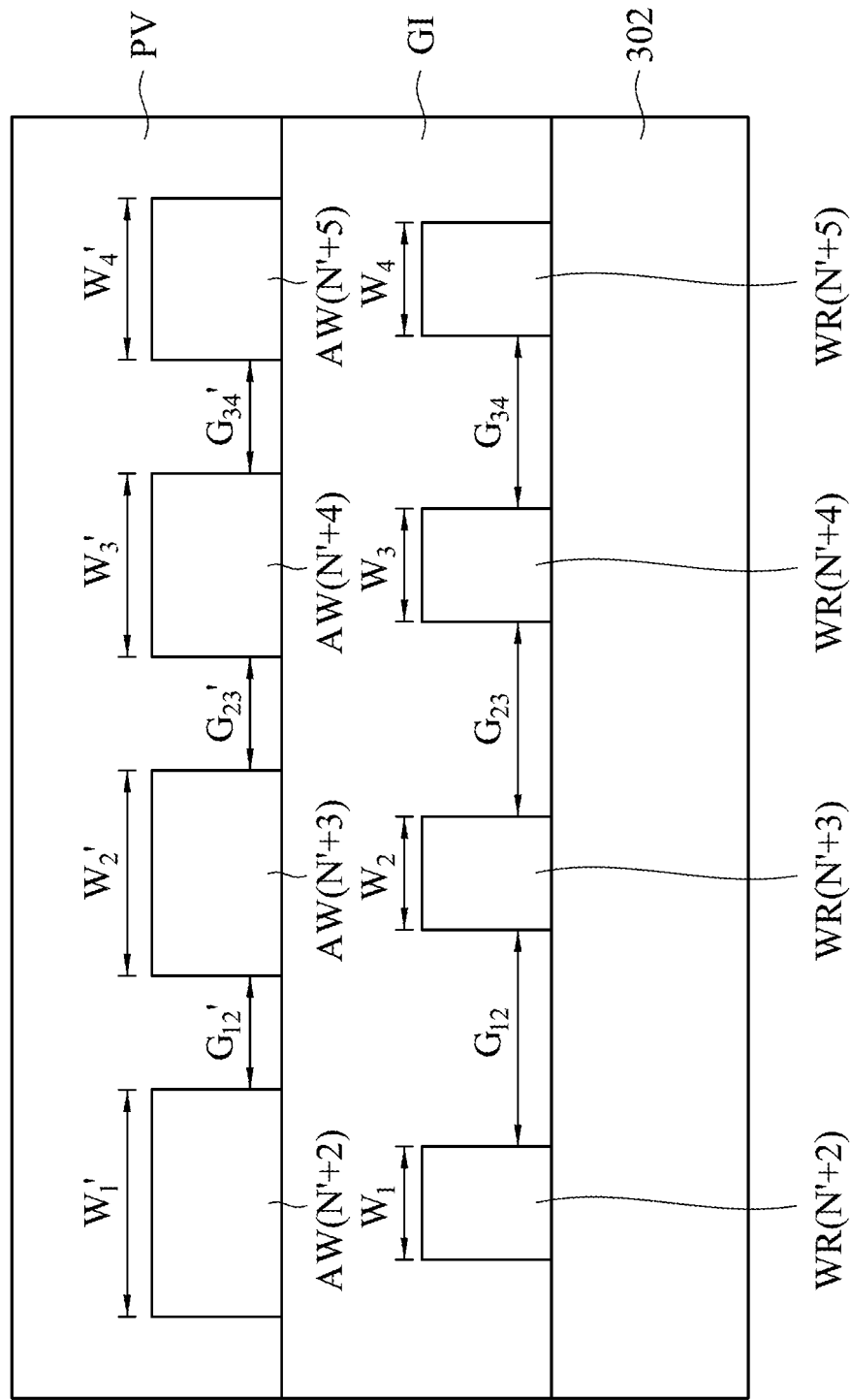
FIG. 11 is a cross-sectional view of a part of the layout along an A-A line of FIG. 10.

FIG. 11 is a cross-sectional view of the layout diagram along an A-A line in FIG. 10. As shown in FIG. 11, the gate insulating layer GI covers the wirings WR(N'+2)-WR(N'+5), the wirings AW(N'+2)-AW(N'+5) are on the gate insulating layer GI and covered by the protective layer PV, respectively overlapped with the wirings WR(N'+2)-WR(N'+5) in the direction perpendicular to the substrate 302. A gap (i.e. $G_{12}$, $G_{23}$ or $G_{34}$) is between any two neighboring ones of the wirings WR(N'+2)-WR(N'+5), and a gap (i.e. $G_{12'}$, $G_{23'}$ or $G_{34'}$) is between is between any two neighboring ones of the wirings AW(N'+2)-AW(N'+5). Because the top sides of the display panel 300 and the active area 310 respectively have the notches 300N, 310N, the first portions of the gate lines SL(N'+1)-SL(N) extend from the subarea 310U1 to the gap 310S (or the notch 310N) between the subareas 310U1, 310U2 to couple the corresponding wirings WR(N'+1)-WR(N), the wirings WR(N'+1)-WR(N) have to pass through the gap 310S (or the notch 310N) between the subareas 310U1, 310U2 for extending into the subarea 310U2 to couple the third portions of the corresponding gate lines SL(N'+1)-SL(N), and therefore at least some of the wirings WR(N'+1)-WR(N) have different lengths. In the invention, the upper wiring and the lower wiring in each double-layer wiring structure are in parallel connection, and therefore at least one of the widths of the upper wiring and the lower wiring can be adjusted to change the resistance of the corresponding gate line. For example, the second portions of at least some gate lines in the irregular region 310U include double-layer wiring structures, by adjusting at least one of the width of the upper wiring and the lower wiring in each double-layer wiring structure, the resistances of the gate lines SL(N'+1)-SL(N) can be adjusted, such that the resistive-capacitive loadings of the gate lines SL(1)-SL(N) can be the same or approximately the same. For example, in the embodiments of FIG. 10 and FIG. 11, the widths of the wirings AW(N'+2)-AW(N'+5) are completely different for adjusting the resistances of the gate lines SL(N'+2)-SL(N'+5). In the embodiment, the widths $W_1$-$W_4$ of the wirings WR(N'+2)-WR(N'+5) are identical, and the relationship of the widths of the wirings AW(N'+2)-AW(N'+5) is $W_{1'}$>$W_{2'}$>$W_{3'}$>$W_{4'}$. However, the invention is not limited thereto. In variant embodiments, the widths $W_1$-$W_4$ of the wirings WR(N'+2)-WR(N'+5) may not be completely identical, and the widths of the wirings AW(N'+2)-AW(N'+5) may be sequentially decreasing or irregularly changing. In addition, the gaps (i.e. $G_{12'}$=$G_{23'}$=$G_{34'}$) between two neighboring ones of the wirings AW(N'+2)-AW(N'+5) are the same. For example, all of the widths of the wirings WR(N'+2)-WR(N'+5) may be 5 microns, the widths $W_1$-$W_4$, of the wirings AW(N'+2)-AW(N'+5) may be respectively 10 microns, 9 microns, 8 microns and 7 microns, and a gap between every two neighboring ones of the wirings AW(N'+2)-AW(N'+5) is 5 microns, but is not limited thereto.

In summary, the combination of FIG. 7A to FIG. 7C, FIG. 10 and FIG. 11 includes pixel unit arrangements in various parts of the irregular region 310U in the active area 310 and the gate line arrangement in various parts of the gap 310S (or the notch 310N) between the subareas 310U1 and 310U2. As shown in FIG. 7A to FIG. 7C, FIG. 10 and FIG. 11, the second portions of at least some of the gate lines in the gap 310S (or the notch 310N) between the subareas 310U1 and 310U2 may include double-layer wiring structures for reducing the resistances of the gate lines, and preferably the upper wirings of at least some of the double-layer wiring structure have different widths and/or the lower wirings of at least some of the double-layer wiring structure have different widths, so as to adjust the resistances of the corresponding gate lines. In addition, the upper wiring and the lower wiring in each double-layer wiring structure are preferably overlapped in the direction perpendicular to the substrate 302, and the two opposite terminals of the upper wiring are coupled to the corresponding lower wiring respectively through connection points (e.g. through-holes) for shrinking the area of the double-layer wiring structures occupied in the peripheral area 320.

Figure 12:
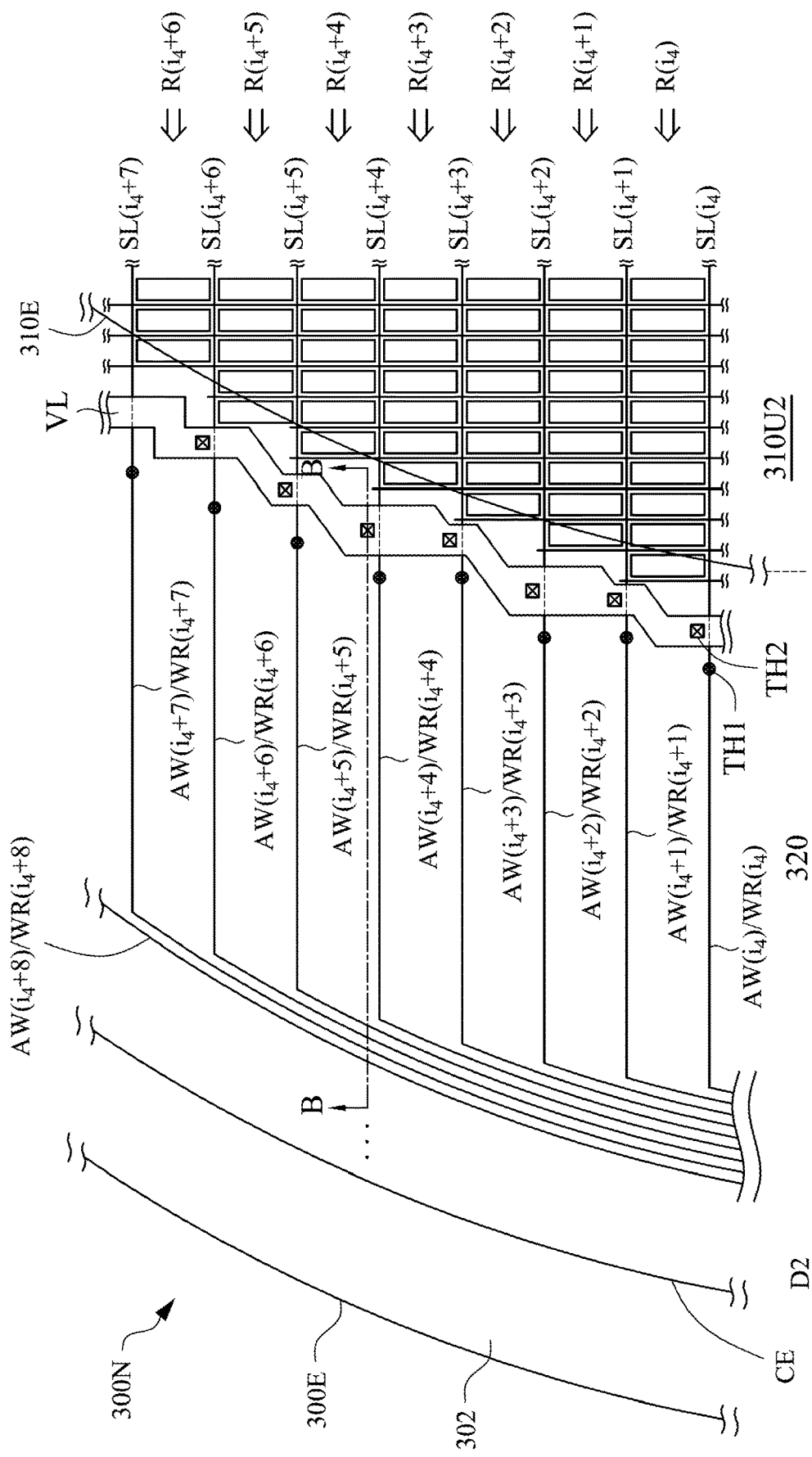
FIG. 12 is a pixel unit and component arrangement in a part of a subarea of the active area in FIG. 3.

FIG. 12 illustrates pixel unit and component arrangements in a part of the subarea 310U2 of the active area 310 corresponding to the area E FIG. 5. As shown in FIG. 12, the pixel units in the pixel rows R($i_4$)-R($i_4$+6) are gradually fewer. In addition, the gate lines SL($i_4$)-SL($i_4$+7) extend from the subarea 310U2 of the active area 310 to the peripheral area 320 and penetrate through the common electrode signal wiring VL. The gate lines SL($i_4$)-SL($i_4$+7) belong the metal layer M1, and the common electrode signal wiring VL belong to the metal layer M2, and therefore the gate lines SL($i_4$)-SL($i_4$+7) are insulated from the common electrode signal wiring VL. After the gate lines SL($i_4$)-SL($i_4$+7) penetrate through the common electrode signal wiring VL, the wirings AW($i_4$)-AW($i_4$+7) are overlapped with the wirings WR($i_4$)-WR($i_4$+7), and terminals of the wirings AW($i_4$)-AW($i_4$+7) are coupled to the wirings WR($i_4$)-WR($i_4$+7) respectively through the through-holes TH1 to form double-layer wirings AW($i_4$)/WR($i_4$)-AW($i_4$+7)/WR($i_4$+7) and bend downwards near the edge 300E of the display panel 300. It is noted that, FIG. 12 is a partial diagram of the right half of the display panel 300, and the other part not shown in FIG. 12 is the bended double-layer wirings AW($i_4$)/WR($i_4$)-AW($i_4$+7)/WR($i_4$+7) extending from the peripheral area 320 between the side edge of the notch 300N of the display panel 300 and the side edge of the notch 310N of the active area 310 to the left half of the display panel 300, and other terminals of the wirings AW($i_4$)-AW($i_4$+7) are coupled to the wirings WR($i_4$)-WR($i_4$+7) respectively through the through-holes TH1, such that the wirings AW($i_4$)-AW($i_4$+7) and at least some portions of the wirings WR($i_4$)-WR($i_4$+7) respectively form parallel structures for reducing the resistances of the gate lines SL($i_4$)-SL($i_4$+7). Then, the wirings WR($i_4$)-WR($i_4$+7) extend toward left to couple the first portions of the gate lines SL($i_4$)-SL($i_4$+7) in the subarea 310U1 of the active area 310. It is noted that, FIG. 12 is a partial diagram of the right half of the display panel 300, and the partial diagram of the left half of the display panel 300 can be obtained by reversing the partial diagram in FIG. 12 by 180 degrees with respect to the second direction D2, but is not limited thereto.

Figure 13:
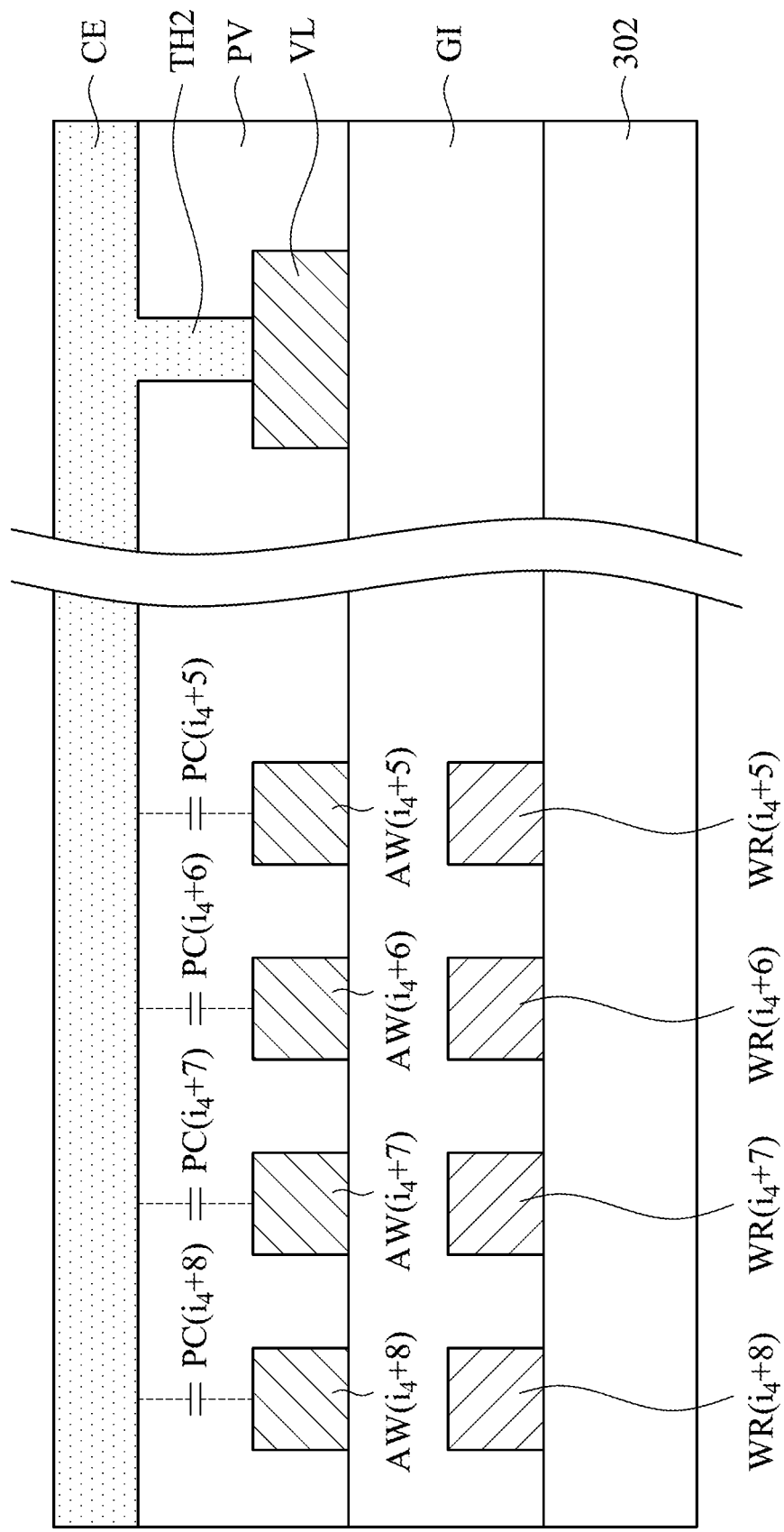
FIG. 13 is a cross-sectional view of a part of the structure along a B-B line of FIG. 12.

In some embodiments, a conductive layer may be disposed in the peripheral area 320 of the display panel 300, and at least a portion of the conductive layer is overlapped with the second portions of at least some of the gate lines in the gap 310S (or the notch 310N) between the subareas 310U1, 310U2 in the direction perpendicular to the substrate 302. The second portions of at least some of the gate lines are double-layer wiring structures, and therefore the conductive layer covers the upper wirings of the double-layer wiring structures, and at least one insulating layer is interposed between the conductive layer and the upper wirings, such that the conductive layer is insulated from the upper wirings, and the conductive layer, at least one insulating layer and the upper wirings form capacitors for increasing the capacitances of the parasitic capacitors on the gate lines. The illustration of the conductive layer disposed in the peripheral area 320 of the display panel 300 is as shown in FIG. 13, which is a cross-sectional view of the partial structure along a B-B line of FIG. 12. In FIG. 13, the wirings WR($i_4$+5)-WR($i_4$+8) are covered by the gate insulating layer GI, the wirings AW($i_4$+5)-AW($i_4$+8) are disposed on the gate insulating layer GI and covered by the protective layer PV, and are respectively overlapped with the wirings WR($i_4$+5)-WR($i_4$+8) in the direction perpendicular to the substrate 302. In addition, the conductive layer CE is on the protective layer PV and electrically insulated from the wirings WR($i_4$+5)-WR($i_4$+8), and is electrically connected to the common electrode signal wiring VL through the through-holes TH2, such that the common electrode signal wiring VL provides a common voltage to the conductive layer CE through the through-holes TH2. In other words, the conductive layer CE may be a common electrode, but is not limited thereto. The parasitic capacitors PC($i_4$+5)-PC($i_4$+8) are respectively generated from the conductive layer CE and the wirings AW($i_4$+5)-AW($i_4$+8) for compensating the parasitic capacitors coupled to the gate lines SL($i_4$+5)-SL($i_4$+8).

As shown in FIG. 12 and FIG. 13, the conductive layer CE may extend from the active area 310 to the peripheral area 320, therefore the conductive layer CE is disposed in the active area 310 and the peripheral area 320, a portion of the conductive layer CE in the peripheral area 320 covers the second portions of at least some of the gate lines in the gap 310S (or the notch 310N) between the subareas 310U1, 310U2, and another portion of the conductive layer CE in the active area 310 includes the common electrode COM in each pixel unit, such that the conductive layer CE is supplied with a common voltage. However, the invention is not limited thereto. In a variant embodiment, the conductive layer CE may include two portions respectively disposed in the active area 310 and the peripheral area 320, and the two portions of the conductive layer CE are electrically connected to each other through another conductive layer. In another embodiment, the conductive layer CE does not include the common electrode COM in each pixel unit and is supplied with a predetermined voltage other than the common voltage (e.g. a grounding voltage or a gate low voltage). In addition, in some other embodiments, at least a portion of the conductive layer CE is overlapped with the second portions of at least some of the gate lines in the gap 310S (or the notch 310N) between the subareas 310U1, 310U2, and the second portions of at least some of the gate lines are single-layer wiring structures, such that the conductive layer CE, the wirings of the single-layer wiring structures and at least one insulating layer therebetween form capacitors for increasing the capacitances of the parasitic capacitors on the gate lines.

Figure 14:
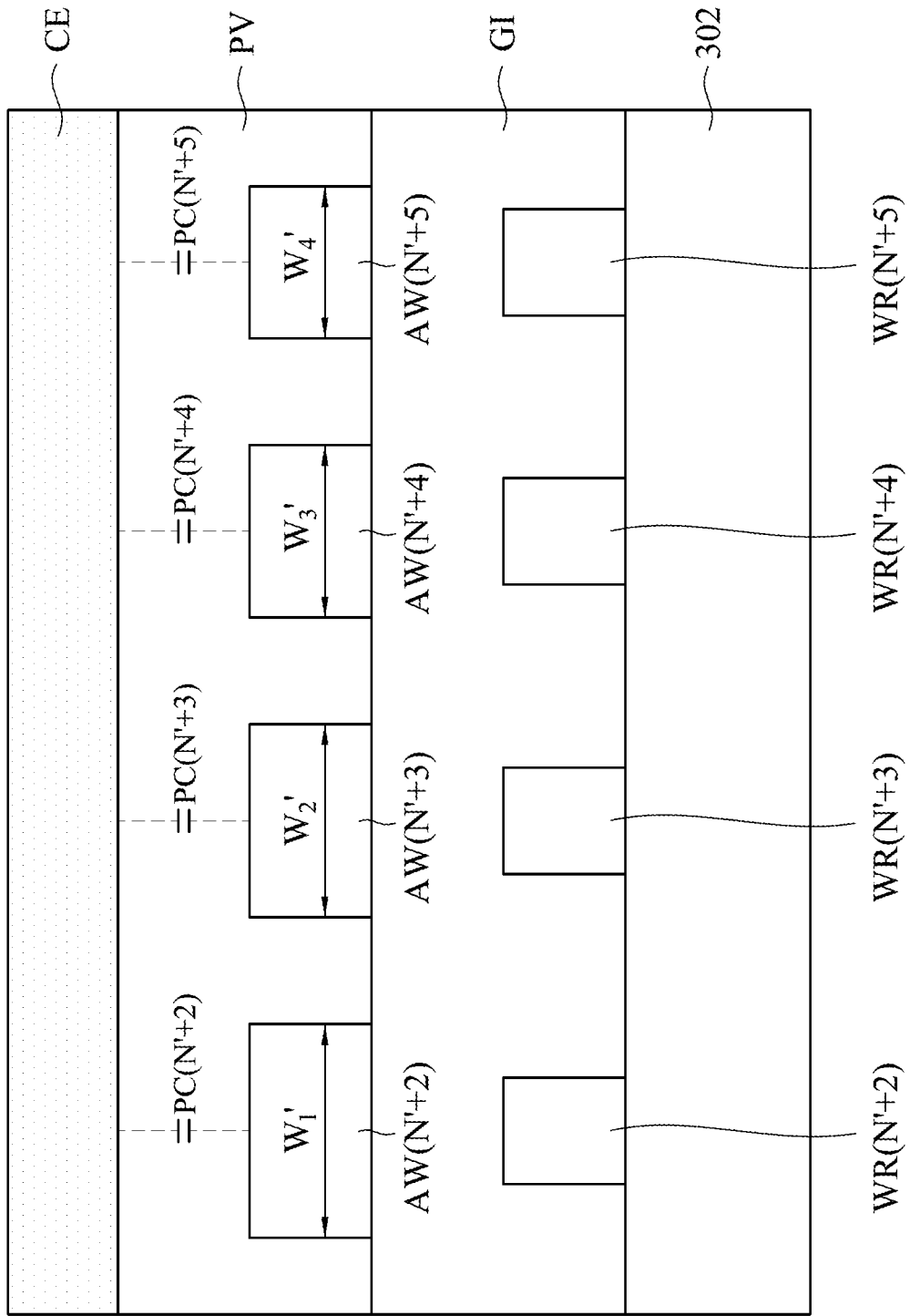
FIG. 14 is a cross-sectional view of the layout diagram in FIG. 10 in addition to a conductive layer CE viewed along the A-A line.

Further, the parasitic capacitors respectively generated from the conductive layer CE and the wirings AW(N'+2)-AW(N) may be associated with the widths of the wirings AW(N'+2)-AW(N). For example, FIG. 14 is a cross-sectional view of the layout diagram in FIG. 10 in addition to the conductive layer CE along the A-A line of FIG. 10. As shown in FIG. 14, the parasitic capacitors PC(N'+2)-PC(N'+5) are respectively generated from the conductive layer CE and the wirings AW(N'+2)-AW(N'+5). Because the relationship of the widths of the wirings AW(N'+2)-AW(N'+5) is $W_1 > W_2 > W_3 > W_4$, the relationship of the capacitances of the parasitic capacitors PC(N'+2)-PC(N'+5) is PC(N'+2)>PC(N'+3)>PC(N'+4)>PC(N'+5). In summary, the second portions of at least some of the gate lines in the gap 310S (or the notch 310N) between the subareas 310U1, 310U2 may include double-layer wiring structures, the conductive layer covers the upper wirings of the double-layer wirings, and at least one insulating layer is interposed between the conductive layer and the upper wirings, so as to increase the parasitic capacitances of the gate lines, and preferably the upper wirings of at least some of the double-layer wiring structure have different widths for adjusting the parasitic capacitances of the gate lines in the irregular region 310U, such that the resistive-capacitive loadings of the gate lines are the same or approximately the same.

Summing the above, the display panel of the invention has an odd-shaped active area and includes resistance and capacitance compensation functions for the gate lines, such that the resistive-capacitive loadings of the gate lines are the same or approximately the same, thus avoiding problems such as image display with incorrect gray levels.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall in the scope of the following claims.

What is claimed is:

1. A display panel having an active area that is odd-shaped and a peripheral area, the active area having a first subarea and a second subarea that are opposite to each other, and the display panel comprising:
   a substrate;
   a plurality of pixel units disposed on the substrate and in the active area;
   a plurality of gate lines disposed on the substrate, each of the gate lines coupled to one or more of the pixel units for providing a scan signal to the one or more of the pixel units, wherein the number of pixel units coupled to a first gate line of the gate lines is smaller than the number of pixel units coupled to a second gate line of the gate lines; and
   at least one dummy thin film transistor disposed on the substrate and coupled to the first gate line, wherein the at least one dummy thin film transistor is disposed in a gap between the first subarea and the second subarea;
   wherein the first gate line has a first portion, a second portion and a third portion respectively in the first subarea, the gap and the second subarea, two terminals of the second portion of the first gate line are respectively coupled to the first portion and the third portion of the first gate line, and the at least one dummy thin film transistor is coupled to the second portion;

wherein the second portion of the first gate line comprises a lower wiring and an upper wiring which are formed from a first metal layer and a second metal layer, respectively, the upper wiring is electrically connected to the lower wiring, and the upper wiring is overlapped with the lower wiring in a direction perpendicular to the substrate;

wherein a third gate line of the gate lines has a first portion, a second portion and a third portion respectively in the first subarea, the gap and the second subarea, the second portion of the third gate line comprises another lower wiring and another upper wiring over the another lower wiring, and the another upper wiring is overlapped with the another lower wiring in the direction perpendicular to the substrate;

wherein a width of the upper wiring is different from a width of the another upper wiring.

2. The display panel of claim 1, wherein the active area further has a rectangular region, the first subarea and the second subarea are connected to a side edge of the rectangular region, and the second gate line is in the rectangular region.

3. The display panel of claim 1, wherein the first portion and the third portion of the first gate line and the lower wiring are formed from the first metal layer, and the upper wiring is formed from the second metal layer.

4. The display panel of claim 1, further comprising:
a conductive layer disposed over and insulated from the second portion of the first gate line, wherein a portion of the conductive layer is overlapped with the second portion of the first gate line in the direction perpendicular to the substrate.

5. The display panel of claim 4, wherein the conductive layer is supplied with a predetermined voltage.

6. The display panel of claim 5, wherein the conductive layer is supplied with a common voltage, each of the pixel units comprises a common electrode, and the conductive layer comprises the common electrodes of the pixel units.

7. The display panel of claim 1, further comprising:
a common electrode signal wiring disposed between an edge of the active area and an edge of the display panel, the at least one dummy thin film transistor disposed between the pixel units and the common electrode signal wiring.

* * * * *